United States Patent
Song et al.

(10) Patent No.: US 10,896,951 B2
(45) Date of Patent: Jan. 19, 2021

(54) SEMICONDUCTOR DEVICES

(71) Applicant: Samsung Electronics Co., Ltd., Suwon-si (KR)

(72) Inventors: Woo-bin Song, Hwaseong-si (KR); Hei-seung Kim, Suwon-si (KR); Mirco Cantoro, Hwaseong-si (KR); Sang-woo Lee, Seoul (KR); Min-hee Cho, Suwon-si (KR); Beom-yong Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 13 days.

(21) Appl. No.: 16/545,906

(22) Filed: Aug. 20, 2019

(65) Prior Publication Data
US 2020/0227519 A1 Jul. 16, 2020

(30) Foreign Application Priority Data
Jan. 10, 2019 (KR) ........................ 10-2019-0003291

(51) Int. Cl.
*H01L 29/06* (2006.01)
*H01L 29/786* (2006.01)
*H01L 29/22* (2006.01)

(52) U.S. Cl.
CPC ...... *H01L 29/0607* (2013.01); *H01L 29/2206* (2013.01); *H01L 29/78693* (2013.01)

(58) Field of Classification Search
CPC ............. H01L 29/0607; H01L 29/2206; H01L 29/78693

USPC .......................................................... 257/43
See application file for complete search history.

(56) References Cited

U.S. PATENT DOCUMENTS

| 8,530,273 | B2 | 9/2013 | Boer |
| 9,356,155 | B2 | 5/2016 | Sandhu |
| 9,722,093 | B1 | 8/2017 | Xing et al. |
| 9,741,752 | B1 | 8/2017 | Hu |
| 2013/0154029 | A1* | 6/2013 | Cai ..................... H01L 29/7848 257/402 |
| 2015/0311287 | A1* | 10/2015 | Nemouchi ...... H01L 21/823814 438/653 |
| 2016/0315100 | A1* | 10/2016 | Yang .................. H01L 27/0688 |
| 2017/0294456 | A1 | 10/2017 | Lee et al. |
| 2018/0083049 | A1 | 3/2018 | Sakata et al. |
| 2018/0102420 | A1 | 4/2018 | Ando et al. |

(Continued)

OTHER PUBLICATIONS

Md M Hasan et al, "Tensile Stress Effect on Performance of a-IGZO, TFTs With Source/Drain Offsets", IEEE EDL, vol. 39, No. 2, Feb. 2018, pp. 204-207.

(Continued)

*Primary Examiner* — Igwe U Anya
(74) *Attorney, Agent, or Firm* — Muir Patent Law, PLLC

(57) ABSTRACT

A semiconductor device includes a channel layer located on a substrate, the channel layer including a conductive oxide, a gate structure located on the channel layer, the gate structure including a gate electrode and gate spacers located on both sidewalls of the gate electrode, and source and drain regions located on both sides of the gate structure in recess regions having a first height from a top surface of the channel layer. The source and drain regions are configured to apply tensile stress to a portion of the channel layer located under the gate structure.

20 Claims, 22 Drawing Sheets

(56) References Cited

U.S. PATENT DOCUMENTS

2018/0331222 A1* 11/2018 Dasgupta ............ H01L 29/0847

OTHER PUBLICATIONS

M M Billah et al, "Effect of Tensile and Compressive Bending Stress on Electrical Performance of Flexible a-IGZO TFTs", IEEE EDL, vol. 38, No. 7, Jul. 2017, pp. 890-893.

* cited by examiner

II-II'

II-II'

II-II'

II-II'

II-II'

II-II'

SEMICONDUCTOR DEVICES

CROSS-REFERENCE TO RELATED APPLICATION

This application claims the benefit of Korean Patent Application No. 10-2019-0003291, filed on Jan. 10, 2019, in the Korean Intellectual Property Office, the disclosure of which is incorporated herein in its entirety by reference.

BACKGROUND

The inventive concept relates to a semiconductor device, and more particularly, to a semiconductor device including an oxide channel layer.

As electronic products tend to be lightweight, thin, and small-sized, the demand for highly integrated semiconductor devices has increased. With the downscaling of semiconductor devices, sizes of components included in transistors are also being reduced. Thus, a leakage current may occur due to a short channel effect. Accordingly, it is necessary to reduce a leakage current of a transistor and improve the reliability of the semiconductor devices.

SUMMARY

The inventive concept provides a semiconductor device having both a low leakage current and an increased on-current.

According to an aspect of the inventive concept, there is provided a semiconductor device including a channel layer located on a substrate, the channel layer including a conductive oxide, a gate structure located on the channel layer, the gate structure including a gate electrode and gate spacers located on both sidewalls of the gate electrode, and source and drain regions located on both sides of the gate structure in recess regions having a first height from a top surface of the channel layer. The source and drain regions are configured to apply tensile stress to a portion of the channel layer located under the gate structure.

According to another aspect of the inventive concept, there is provided a semiconductor device including a channel layer located on a substrate, the channel layer including a conductive oxide, a gate structure located on the channel layer, the gate structure including a gate electrode and gate spacers located on both sides of the gate electrode, and source and drain regions located on both sides of the gate structure in recess regions having a first height from a top surface of the channel layer. The source and drain regions partially overlap the gate spacers with respect to a top down view (i.e., in a direction perpendicular to a top surface of the substrate).

According to another aspect of the inventive concept, there is provided a semiconductor device including a channel layer located on a substrate, a gate structure located on the channel layer, the gate structure including gate spacers located on both sidewalls of the gate electrode, and source and drain regions located on both sides of the gate structure in recess regions having a first height from a top surface of the channel layer, the source and drain regions being configured to apply tensile stress to a portion of the channel layer located under the gate structure. The channel layer includes a material expressed by formula $RAO_3(MO)_m$, wherein R is at least one of scandium (Sc), ytterbium (Yb), lutetium (Lu), and indium (In), A is at least one of gallium (Ga), aluminum (Al), iron (Fe), and indium (In), M is at least one of zinc (Zn) and magnesium (Mg), and m is an integer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Embodiments will now be described more fully with reference to the accompanying drawings in which some embodiments are shown.

Figure 1:
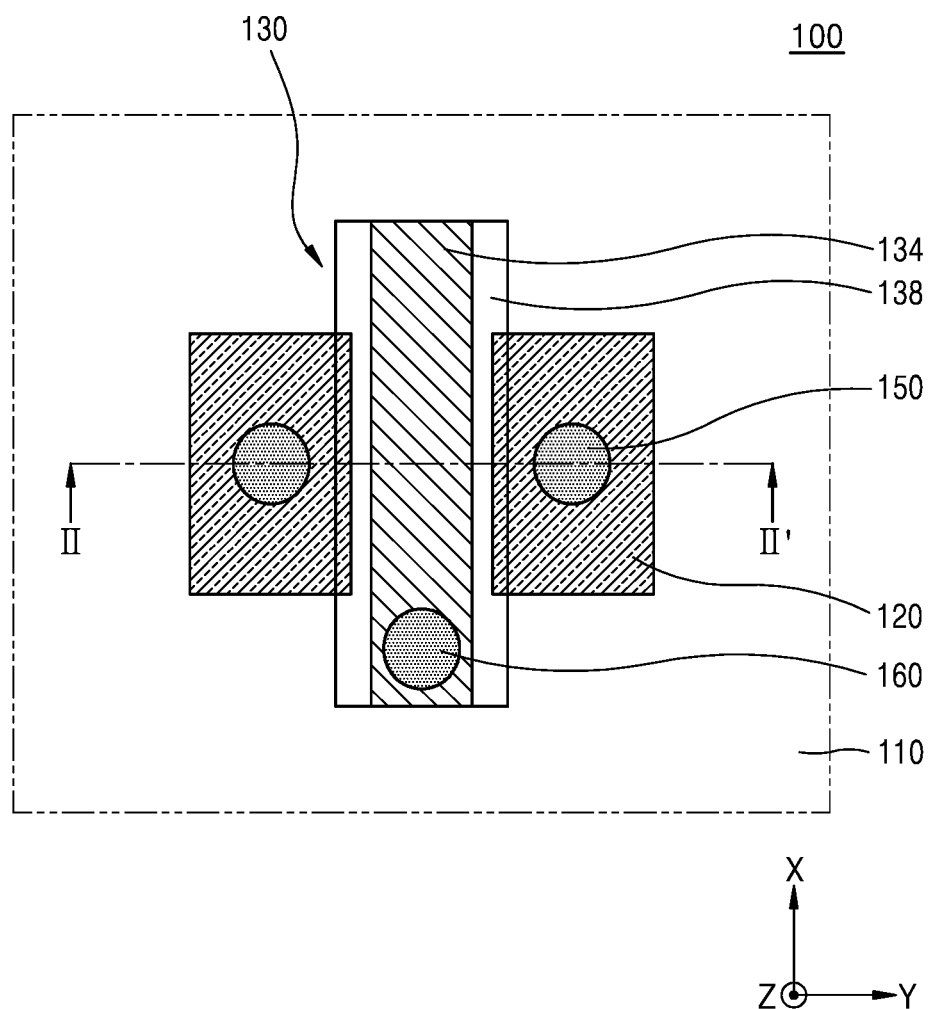
FIG. 1 illustrates a layout of a semiconductor device according to example embodiments.
Figure 2:
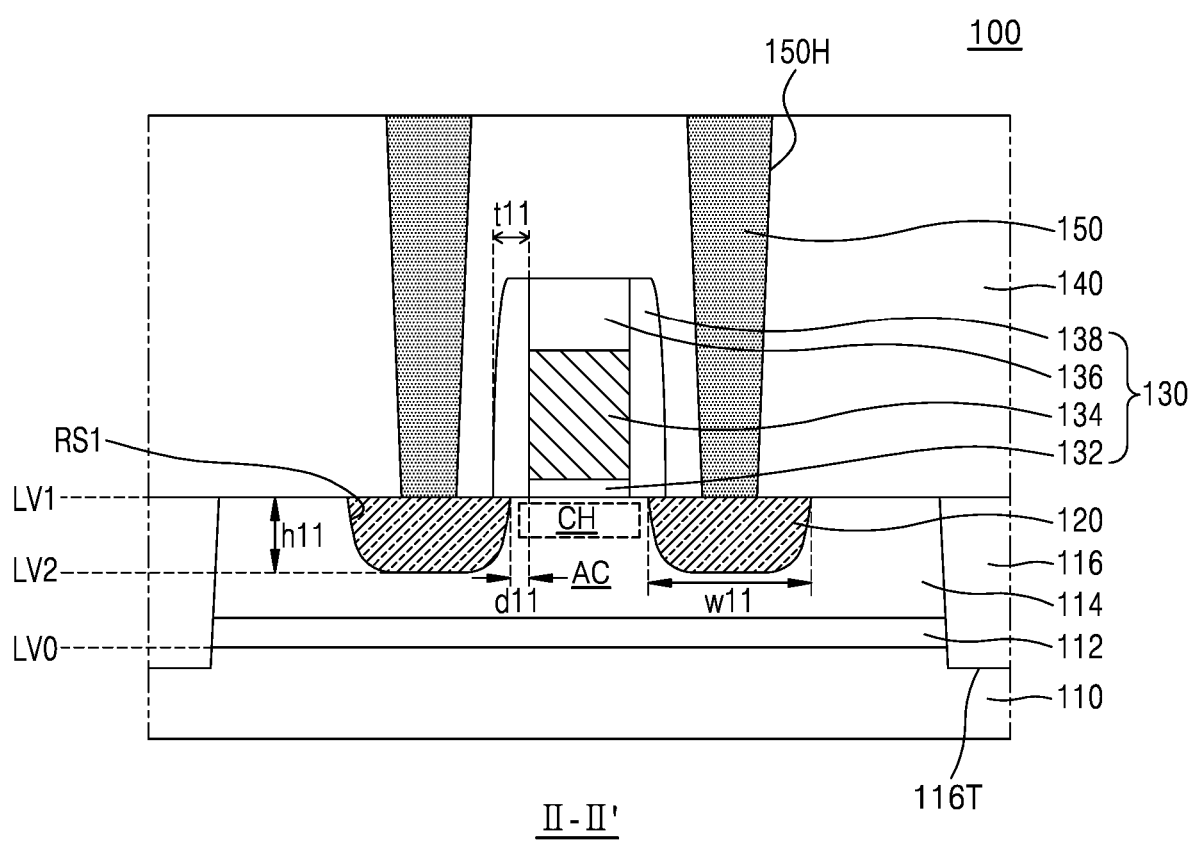
FIG. 2 is a cross-sectional view taken along a line II-II' of FIG. 1 according to example embodiments.

FIG. 1 illustrates a layout of a semiconductor device 100 according to example embodiments. FIG. 2 is a cross-sectional view taken along a line II-II' of FIG. 1 according to example embodiments. Only some components of the semiconductor device 100 are illustrated in FIG. 1 for brevity.

Referring to FIGS. 1 and 2, the semiconductor device 100 may include a channel layer 114, source and drain regions 120, a gate structure 130, a contact plug 150, and a gate contact 160, which may be located on a substrate 110.

In example embodiments, the substrate 110 may include a Group IV semiconductor, such as silicon (Si) or germanium (Ge), a Group IV-IV compound semiconductor, such as silicon germanium (SiGe) or silicon carbide (SiC), or a Group III-V compound semiconductor, such as gallium arsenide (GaAs), indium arsenide (InAs), or indium phosphide (InP). The substrate 110 may include a conductive region, for example, a doped well or a doped structure.

A barrier insulating layer 112 may be located on the substrate 110. The barrier insulating layer 112 may include at least one of silicon oxide, silicon nitride, and aluminum oxide. For instance, the barrier insulating layer 112 may function as a buffer layer configured to reduce stress caused by a difference in lattice constant between a material for the substrate 110 and a material for the channel layer 114. Alternatively, the barrier insulating layer 112 may function as a barrier layer configured to prevent the diffusion of impurities (e.g., hydrogen atoms) from the substrate 110 into the channel layer 114 and prevent the leakage of current flowing in the channel layer 114 into the substrate 110.

The channel layer 114 may be located on the barrier insulating layer 112. The channel layer 114 may have a flat top surface, and a top level LV1 of the channel layer 114 may be higher than a top level LV0 of the substrate 110. Hereinafter, each of a plurality of levels LV0 to LV3 may be referred to as a vertical level with respect to a top surface of the substrate 110.

In example embodiments, the channel layer 114 may include a conductive oxide. For example, the channel layer 114 may include a homologous oxide. Here, the homologous oxide may refer to a material expressed by formula $RAO_3(MO)_m$ (here, R is at least one of scandium (Sc), ytterbium (Yb), lutetium (Lu), and indium (In); A is at least one of gallium (Ga), aluminum (Al), iron (Fe), and indium (In); M is at least one of zinc (Zn) and magnesium (Mg), and m is an integer). However, elements R, A, and M that may be included in the homologous oxide are not limited to the elements listed above. In example embodiments, the channel layer 114 may include $InGaZnO_x$, $InGaSiO_x$, $InSnZnO_x$ (ITZO), $InZnO_x$ (IZO), $SnO_2$, $HfInZnO_x$ (HIZO), or $YbGaO_3(ZnO)_5$ (YGZO), or a combination thereof.

In example embodiments, the channel layer 114 may have an amorphous structure or a c-axially aligned crystalline structure. For example, when the channel layer 114 includes $InGaZnO_x$ having a c-axially aligned crystalline structure, the channel layer 114 may have an $YbFe_2O_4$-based crystalline structure. In the $YbFe_2O_4$-based crystalline structure, an $InO_2$ layer having a hexagonal arrangement may be arranged in a layered structure along a c-axis direction, and $(Ga, Zn)O_x$ may be arranged between two adjacent $InO_2$ layers. However, the crystalline structure of the channel layer 114 is not limited thereto. Optionally, the channel layer 114 may be doped with impurities of at least one element of fluorine (F), hydrogen (H), nitrogen (N), magnesium (Mg), yttrium (Y), ruthenium (Ru), and arsenic (As). For instance, to dope the channel layer 114 with impurities of at least one element, the impurities may be doped in-situ during the formation of the channel layer 114 or impurity ions may be implanted after the formation of the channel layer 114.

A device isolation film 116 may be formed on the substrate 110 and define an active region AC in the channel layer 114. The channel layer 114 may include the active region AC, which may constitute an NMOS transistor. In another case, the channel layer 114 may include the active region AC, which may constitute a PMOS transistor. For example, the NMOS transistor or the PMOS transistor may be included as a component in a semiconductor device, such as a memory device, for example, a dynamic random access memory (DRAM) device, a phase change random access memory (PRAM), a static random access memory (SRAM), a NAND flash memory, a NOR flash memory, an electrically erasable programmable read-only memory (EEPROM), a resistive random access memory (RRAM), a nano floating gate memory (NFGM), a polymer random access memory (PoRAM), a magnetic random access memory (MRAM), and a ferroelectric random access memory (FRAM), a complementary metal-oxide semiconductor (CMOS) image sensor, and a logic device.

The device isolation film 116 may be located inside a device isolation trench 116T, which may pass through the channel layer 114 and the barrier insulating layer 112 and extend into the substrate 110. The device isolation film 116 may include silicon oxide, flowable CVD (FCVD) oxide, tetraethyl orthosilicate (TEOS) oxide, and/or high-density plasma (HDP) oxide, but the inventive concept is not limited thereto. A bottom surface of the device isolation film 116 may be at a level lower than the top level LV0 of the substrate 110.

The gate structure 130 may be located on the channel layer 114 and extend in a first direction (refer to X direction in FIG. 2). The gate structure 130 may include a gate insulating layer 132, a gate electrode 134, a gate capping layer 136, and gate spacers 138.

The gate insulating layer 132 may be located on the channel layer 114. The gate insulating layer 132 may include a silicon oxide film, a silicon oxynitride film, a high-k dielectric film having a dielectric constant higher than that of a silicon oxide film, or a combination thereof. The high-k dielectric film may include a metal oxide or a metal oxynitride. For example, the high-k dielectric film, which may be used for the gate insulating layer 132, may include $HfO_2$, HfSiO, HfSiON, HfTaO, HfTiO, HfZrO, zirconium oxide, aluminum oxide, or a combination thereof, but is not limited thereto.

The gate electrode 134 may be located on the gate insulating layer 132. The gate electrode 134 may include doped polysilicon (poly-Si), a metal, or a combination thereof.

The gate capping layer 136 may be located on the gate electrode 134. The gate capping layer 136 may cover a top surface of the gate electrode 134 and extend in a first direction (refer to X direction in FIG. 2). For example, the gate capping layer 136 may include silicon nitride.

The gate spacers 138 may be located on both sidewalls of the gate insulating layer 132, the gate electrode 134, and the gate capping layer 136 and extend in the first direction (refer to X direction in FIG. 2). In example embodiments, the gate spacers 138 may include silicon oxide ($SiO_x$), silicon nitride ($SiN_x$), silicon oxynitride ($SiO_xN_y$), silicon carbonitride ($SiC_xN_y$), silicon oxycarbonitride ($SiO_xC_yN_z$) or a combination thereof. Each of the gate spacers 138 may have a first thickness t11 in a second direction (refer to Y direction in FIG. 2). The first thickness t11 may range from about 2 nm to about 20 nm, but the inventive concept is not limited thereto.

In example embodiments, the gate spacers 138 may include a plurality of layers including respectively different materials. Although the gate spacers 138 are exemplarily illustrated as a single layer in FIG. 2, in another case, the gate spacers 138 may include a first spacer layer (not shown), a second spacer layer (not shown), and a third spacer layer (not shown), which may be sequentially stacked on sidewalls of the gate electrode 134 and the gate capping layer 136. In example embodiments, the first spacer layer and the third spacer layer may include silicon nitride, silicon oxide, or silicon oxynitride. The second spacer layer may include an insulating material having a dielectric constant lower than that of the first spacer layer. For example, the second spacer layer may include an air space.

Recess regions RS1 having a first height h11 from a top surface of the channel layer 114 may be formed in the channel layer 114 on both sides of the gate structure 130. The source and drain regions 120 may be located in the recess regions RS1. The channel layer 114 provided with the source and drain regions 120 may be located on the barrier insulating layer 112. For example, as shown in FIG. 2, a bottom level LV2 of the recess region RS1 may be higher than the top level LV0 of the substrate 110 and lower than the top level LV1 of the channel layer 114. The recess region RS1 may have a greatest width w11 at a top surface of the recess region RS1 in the Y direction and have such a sectional shape that a width of the recess region RS1 is reduced toward a bottom portion of the recess region RS1. A boundary between the bottom and a sidewall of the recess region RS1 may be rounded. However, a shape of the recess region RS1 is not limited thereto.

In example embodiments, the source and drain regions 120 may include amorphous $InO_3$—ZnO (IZO), $InGaSiO_x$, phosphorus (P)-doped silicon, arsenic (As)-doped silicon, phosphorus-doped germanium, or arsenic-doped germanium, or a combination thereof. The formation of the source and drain regions 120 may include removing portions of the channel layer 114 on both sides of the gate structure 130 to form the recess regions RS1 and filling the recess regions RS1 with the above-described material using a selective epitaxial growth (SEG) process. The source and drain regions 120 may be doped in-situ with impurities during the selective epitaxial growth process, or impurity ions may be implanted after the formation of the source and drain regions 120.

In example embodiments, the source and drain regions 120 may include a compressively strained material. The source and drain regions 120 may serve as a stressor configured to apply tensile stress to a portion (i.e., a channel region CH) of the channel layer 114 located under the gate structure 130. Also, the source and drain regions 120 may serve as a stressor configured to apply tensile stress to the channel layer 114. Since the source and drain regions 120 are configured to apply tensile stress to the portion of the channel layer 114, the mobility and density of state (DOS) of carriers (e.g., electrons) in the channel region CH may be improved. Meanwhile, the channel region CH is schematically illustrated in FIG. 2 for brevity, and a shape of the channel region CH may be different from that shown in FIG. 2.

In example embodiments, the source and drain regions 120 may include a material that is different from that of the channel layer 114. For example, the channel layer 114 may include $InGaZnO_x$, and the source and drain regions 120 may include $InGaSiO_x$. In other embodiments, the source and drain regions 120 may include a material, which may include the same element as the channel layer 114 at a different content from that of the channel layer 114. For example, the channel layer 114 may include $In_xGa_ySi_zO_w$, and the source and drain regions 120 may include $In_xGa_ySi_zO_w$. In this case, contents x, y, z, and w of respective elements included in the channel layer 114 may be different from contents x, y, z, and w of respective elements included in the source and drain regions 120. In other embodiments, the source and drain regions 120 may include a material, which may include the same element as the channel layer 114 and have a crystalline structure different from that of the channel layer 114. For example, the channel layer 114 may include crystalline $InZnO_x$ (IZO), and the source and drain regions 120 may include amorphous $InO_3$—ZnO (IZO). In other embodiments, the source and drain regions 120 may include a material having a lattice constant, which is lower than that of the channel layer 114.

For example, when the active region AC is an active region of an NMOS transistor, the source and drain regions 120 may serve as a stressor configured to apply tensile stress to the channel layer 114. However, the inventive concept is not limited thereto. When the active region AC is an active region of a PMOS transistor, materials included in the channel layer 114 and the source and drain regions 120 may be appropriately selected so that the source and drain regions 120 may serve as a stressor configured to apply compressive stress to the channel layer 114. Since the source and drain regions 120 are configured to apply compressive stress to a portion of the channel layer 114, the mobility and DOS of carriers (e.g., holes) in the channel region CH may be improved.

As shown in FIG. 2, the source and drain regions 120 may be formed in the recess regions RS1, and portions of the recess regions RS1 may overlap portions of the gate spacers 138 in a vertical direction (e.g., Z direction of FIG. 2). A shortest distance d11 between the sidewall of the recess region RS1 and the gate electrode 134 may be less than the first thickness t11 of the gate spacers 138 in the second direction (Y direction). For example, the shortest distance d11 between the sidewall of the recess region RS1 and the gate electrode 134 may range from about 1 nm to about 10 nm, but the inventive concept is not limited thereto. In addition, since the source and drain regions 120 are formed to fill the recess regions RS1, a shortest distance between each of the source and drain regions 120 and the gate electrode 134 may also be substantially equal to the shortest distance d11 between the sidewall of the recess region RS1 and the gate electrode 134.

Figure 10A:
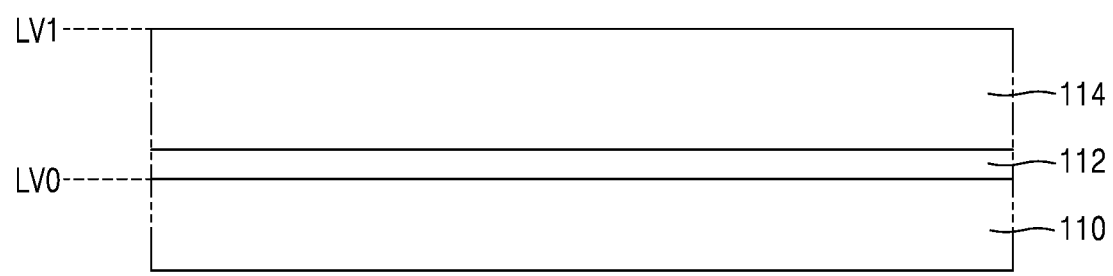
FIGS. 10A to 10H are cross-sectional views illustrating a method of manufacturing a semiconductor device according to example embodiments.
Figure 10A:
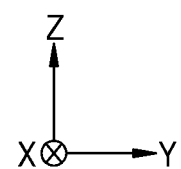
Figure 10B:
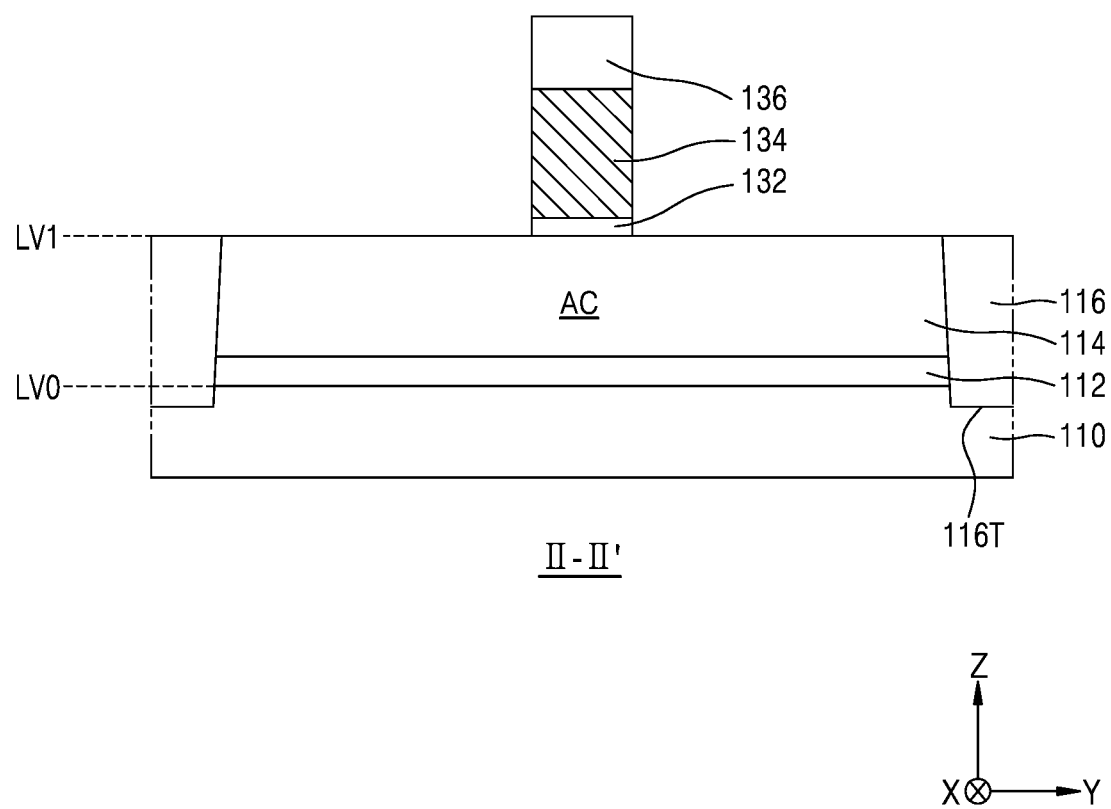
Figure 10C:
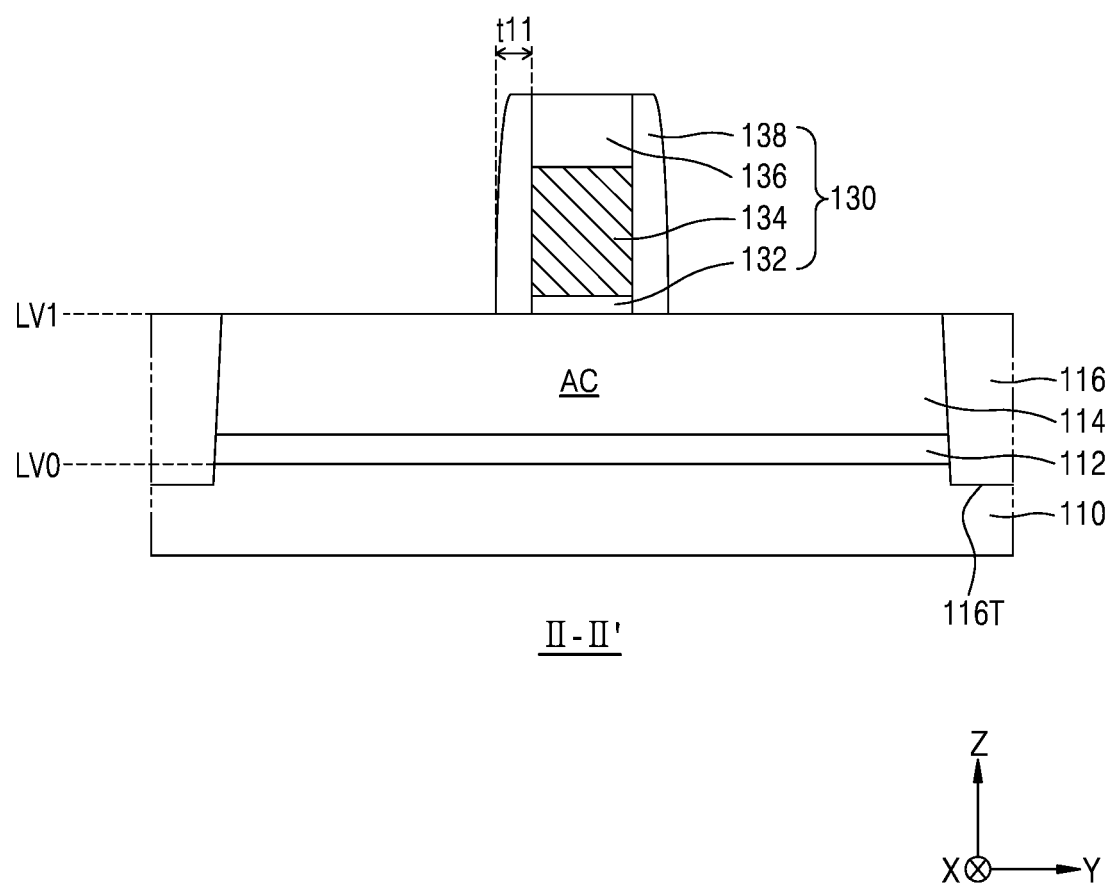
Figure 10D:
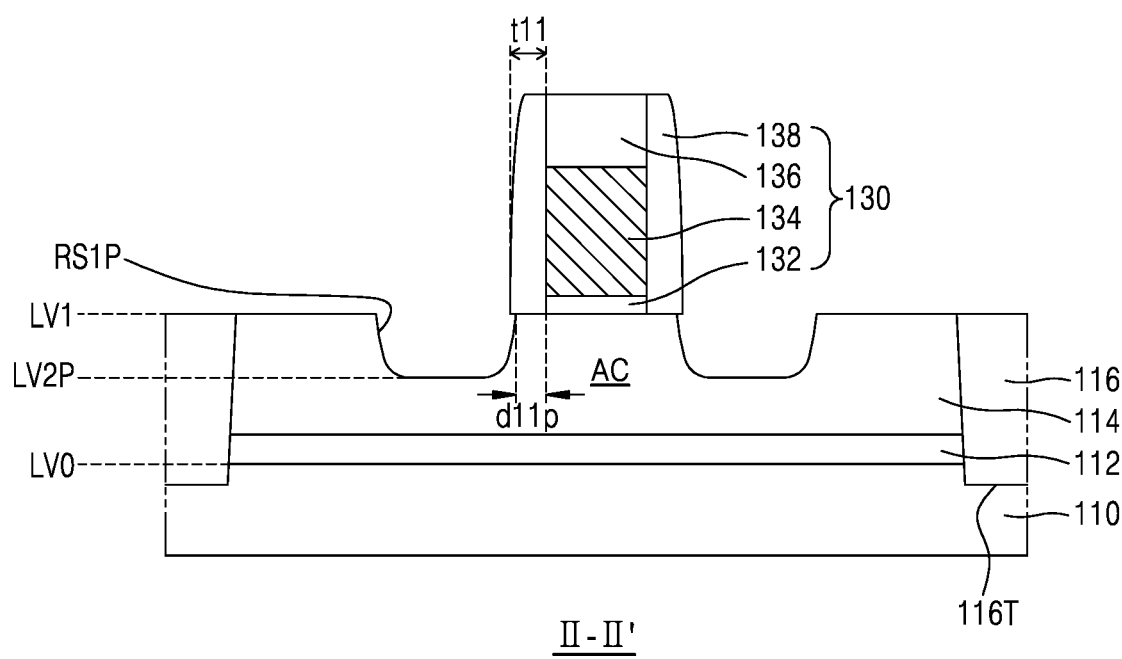
Figure 10D:
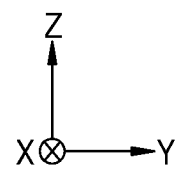

In a manufacturing method according to an example embodiment, portions of the channel layer 114 on both sides of a gate structure 130 may be removed to form preliminary recess regions (refer to RS1P in FIG. 10D). By expanding the preliminary recess region RS1P in a lateral direction, the recess region RS1 may partially overlap the gate spacers 138. In a manufacturing method according to another example embodiment, portions of the channel layer 114 on both sides of the gate structure 130 may be removed using an isotropic etching process. Thus, the recess region RS1 may partially overlap the gate spacers 138.

In a semiconductor device having a typical structure in which portions of the channel layer 114 on both sides of the gate structure 130 are doped with impurities to form source and drain regions, portions of the channel layer 114 located directly under the gate spacers 138 (e.g., underlap portions of the channel layer 114 that vertically overlap the gate spacers 138) may be doped with impurities at a relatively low concentration. Thus, the performance of the semiconductor device may be degraded. For example, the underlap portions of the channel layer 114 may have a high resistance, and the semiconductor device may have a relatively low on-current.

According to the above-described example embodiment, the source and drain regions 120 may be formed in the recess regions RS1, which partially overlap the gate spacers 138, and thus, the underlap portions may have a relatively small width. As a result, the semiconductor device 100 may have an increased on-current. In addition, since the source and drain regions 120 are formed to partially overlap the gate spacers 138, a relatively high tensile stress may be applied to the channel region CH located under the gate electrode 134. Thus, the mobility and DOS of carriers in the channel region CH may be increased.

An interlayer insulating film 140 may be located on the channel layer 114, the device isolation film 116, and the source and drain regions 120 to cover the gate structure 130. The interlayer insulating film 140 may include silicon nitride, silicon oxide, silicon oxynitride, a TEOS film, or an ultralow-k (ULK) film having an ultra-low dielectric constant of about 2.2 to about 2.4.

The contact plug 150 may pass through the interlayer insulating film 140 and be electrically connected to the source and drain regions 120. Also, as shown in FIG. 1, the gate contact 160 may pass through the interlayer insulating film 140 and the gate capping layer 136 and be electrically connected to the gate electrode 134.

The contact plug 150 and the gate contact 160 may include doped polysilicon, a metal, a metal nitride, a metal silicide, or a combination thereof. For instance, the contact plug 150 and the gate contact 160 may have a double-layered structure including a metal filling layer (not shown) and a conductive barrier layer (not shown) configured to surround a side surface and a bottom surface of the metal filling layer. For example, the metal filling layer may include at least one of cobalt (Co), tungsten (W), nickel (Ni), ruthenium (Ru), copper (Cu), aluminum (Al), a silicide thereof, or an alloy thereof, and the conductive barrier layer may include titanium (Ti), tantalum (Ta), ruthenium (Ru), titanium nitride (TiN), tantalum nitride (TaN), or a combination thereof, but the inventive concept is not limited thereto. When the contact plug 150 includes a double layer of metal materials, the contact plug 150 may serve as an additional stressor configured to apply tensile stress to the channel region CH and/or the source and drain regions 120.

Although FIG. 1 illustrates an example in which one contact plug 150 is located on each of two sides of the gate structure 130, at least two contact plugs 150 may be located on each of the two sides of the gate structure 130.

In general, as sizes of components included in transistors are reduced, a short channel effect may occur, and a leakage current may increase. For example, a homologous oxide (e.g., IGZO) has been proposed as a material for a channel layer of a thin-film transistor (TFT). However, although the homologous oxide has a low leakage current, the homologous oxide may not have sufficient carrier mobility to be used for silicon-based semiconductor devices, such as a memory device, a CMOS image sensor, and a logic device.

However, according to the above-described example embodiments, due to the source and drain regions 120 formed in the recess regions RS1 and configured to apply tensile stress to the channel layer 114, the channel layer 114 including the homologous oxide may have improved carrier mobility. Also, since the recess regions RS1 vertically overlap the gate spacers 138, an increase in resistance caused by the underlap portion located under the channel layer 114 may be prevented. Accordingly, the semiconductor device 100 may have both a low leakage current and improved on-current characteristics.

Figure 3:
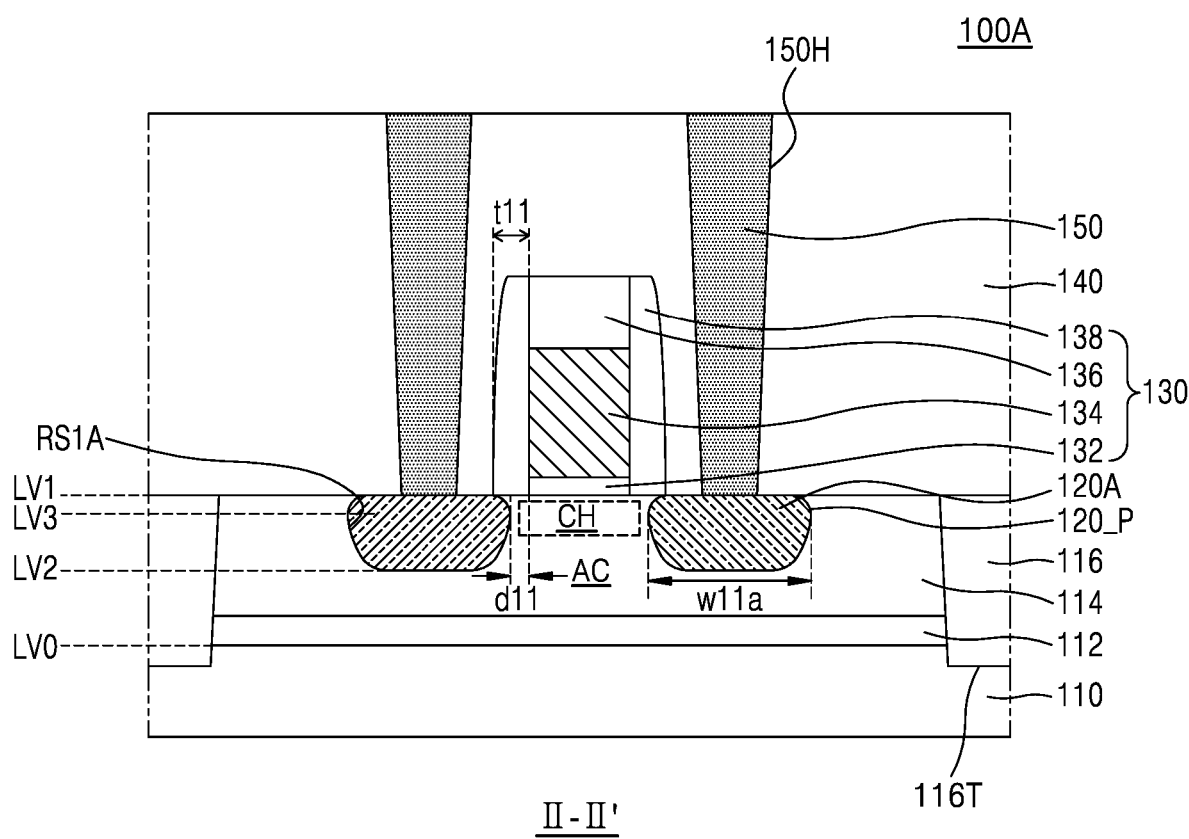
FIG. 3 is a cross-sectional view of a semiconductor device according to example embodiments.
Figure 3:
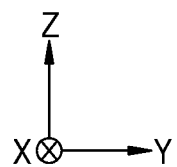

FIG. 3 is a cross-sectional view of a semiconductor device 100A according to example embodiments. FIG. 3 is a cross-sectional view corresponding to a cross-section taken along a line II-IP of FIG. 1. In FIG. 3, the same reference numerals are used to denote the same elements as in FIGS. 1 and 2.

Referring to FIG. 3, each of source and drain regions 120A of the semiconductor device 100A may include a protrusion 120_P, which may protrude outward. A boundary between a sidewall and a bottom of each of the source and drain regions 120A may have a rounded shape. A level LV3 of the protrusion 120_P may be lower than a top level LV1 of a channel layer 114 and higher than a bottom level LV2 of recess regions RS1A. The level LV3 of the protrusion 120_P may be also lower than top surfaces of the source and drain regions 120A.

As shown in FIG. 3, in a second direction (Y direction), each of the source and drain regions 120A may have a greatest width w11a at the same level as the level LV3 of the protrusion 120_P. Also, in the Y direction, a shortest distance d11 between the recess region RS1A and a gate electrode 134 may be obtained at the same level as the level LV3 of the protrusion 120_P. The shortest distance d11 between the recess region RS1A and the gate electrode 134 may be less than a first thickness t11 of each of gate spacers 138, which is measured in the Y direction. For example, in the Y direction, a distance between the recess region RS1A and the gate electrode 134 at the top level LV1 of the channel layer 114 may be greater than the shortest distance d11 between the recess region RS1A and the gate electrode 134.

In a manufacturing method according to an example embodiment, portions of the channel layer 114 on both sides of a gate structure 130 may be removed to form preliminary recess regions (refer to RS1P in FIG. 10D). By expanding the preliminary recess region RS1P in a lateral direction, portions of sidewalls of the recess region RS1A may have a shape corresponding to the protrusion 120_P. In a manufacturing method according to another example embodiment, portions of the channel layer 114 on both sides of the gate structure 130 may be removed using an isotropic etching process. Thus, portions of sidewalls of the recess region RS1A may have a shape corresponding to the protrusion 120_P.

In a semiconductor device having a typical structure in which portions of the channel layer 114 on both sides of the gate structure 130 are doped with impurities to form source and drain regions, portions of the channel layer 114 located directly under the gate spacers 138 (e.g., underlap portions of the channel layer 114 that vertically overlap the gate spacers 138) may be doped with impurities at a relatively low concentration. Thus, the performance of the semiconductor device may be degraded. For example, the underlap portions of the channel layer 114 may have a high resistance, and the semiconductor device may have a relatively low on-current.

According to the above-described example embodiment, the source and drain regions 120A including the protrusions 120_P may be formed in the recess regions RS1A, and thus, the underlap portions may have a relatively small width. As a result, the semiconductor device 100A may have an increased on-current. In addition, since the source and drain regions 120A have a relatively large volume, a relatively large tensile stress may be applied to the channel region CH located under the gate electrode 134. Thus, the mobility and DOS of carriers in the channel region CH may be increased. Accordingly, the semiconductor device 100A may have both a low leakage current and improved on-current characteristics.

Figure 4:
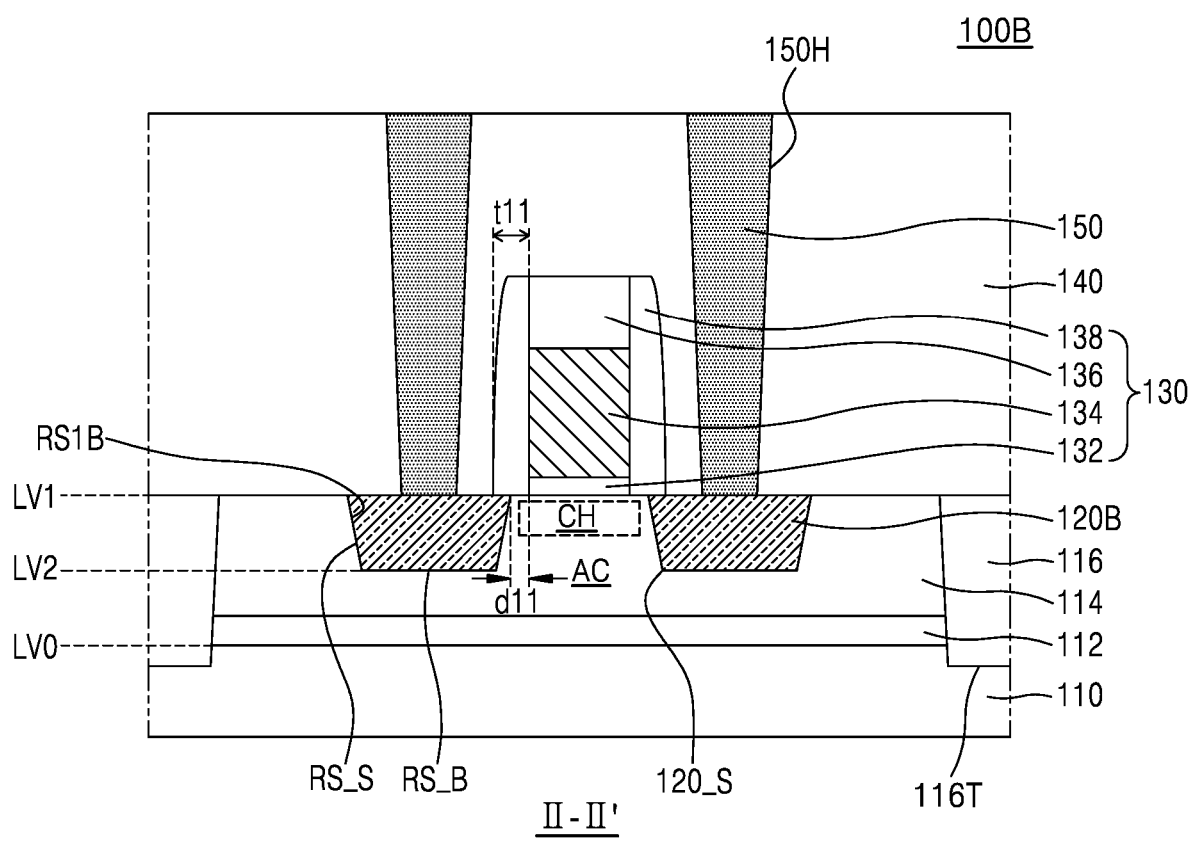
FIG. 4 is a cross-sectional view of a semiconductor device according to example embodiments.

FIG. 4 is a cross-sectional view of a semiconductor device 100B according to example embodiments. FIG. 4 is a cross-sectional view corresponding to the cross-section taken along the line II-II' of FIG. 1. In FIG. 4, the same reference numerals are used to denote the same elements as in FIGS. 1 to 3.

Referring to FIG. 4, each of recess regions RS1B of the semiconductor device 100B may have inclined sidewalls RS_S and a flat bottom surface RS_B. Source and drain regions 120B of the semiconductor device 100B may be located inside recess regions RS1B, respectively. Each of the source and drain regions 120B may include a step unit 120_S at a boundary between the inclined sidewall RS_S and the flat bottom surface RS_B.

In a manufacturing method according to an example embodiment, portions of a channel layer 114 on both sides of a gate structure 130 may be removed using an anisotropic etching process to form preliminary recess regions (refer to RS1P in FIG. 10D). By expanding the preliminary recess regions RS1P in a lateral direction, inclined sidewalls RS_S of the recess regions RS1B may be formed at positions that overlap gate spacers 138.

According to the above-described example embodiments, due to the source and drain regions 120B formed in the recess regions RS1B and configured to apply tensile stress to the channel layer 114 (e.g., a channel region CH), the channel layer 114 including a homogenous oxide may have improved carrier mobility and DOS. Also, since the recess regions RS1B vertically overlap the gate spacers 138, an increase in resistance caused by an underlap portion located under the channel layer 114 may be prevented. Accordingly, the semiconductor device 100B may have a low leakage current and improved on-current characteristics.

Figure 5:
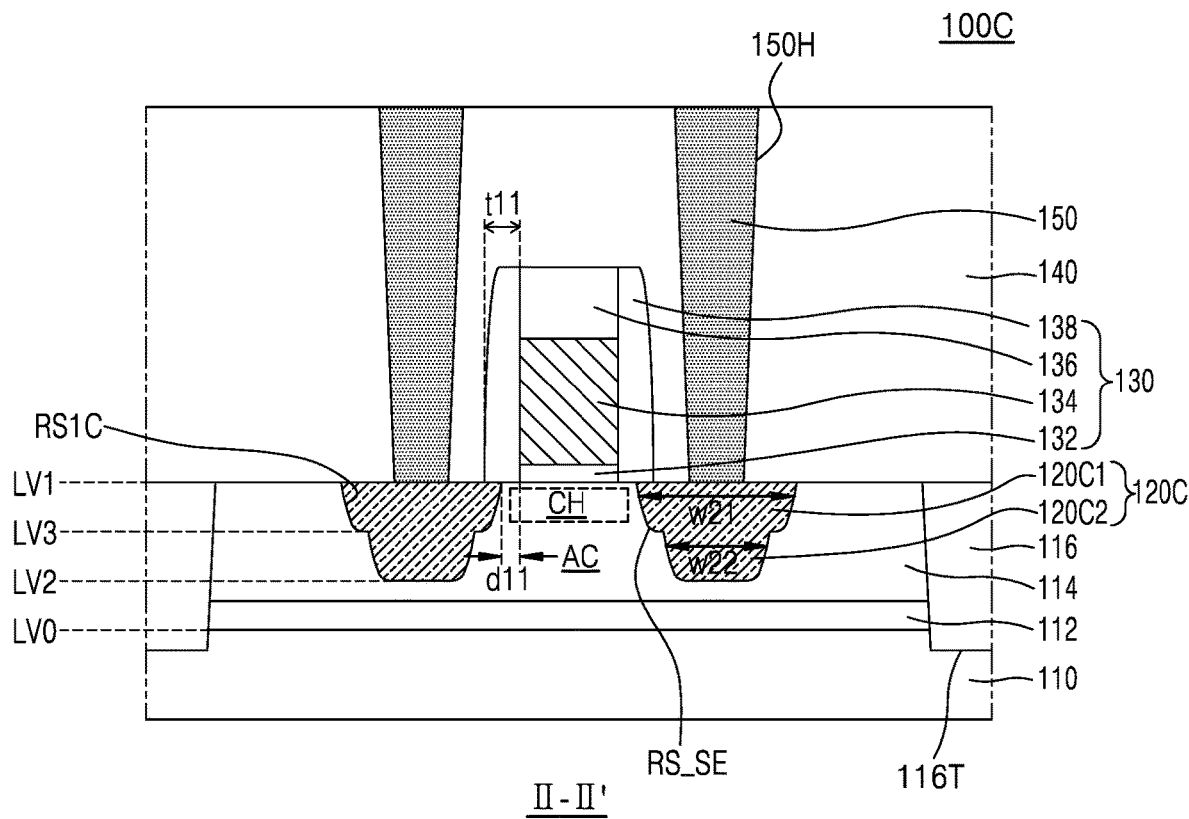
FIG. 5 is a cross-sectional view of a semiconductor device according to example embodiments.

FIG. 5 is a cross-sectional view of a semiconductor device 100C according to example embodiments. FIG. 5 is a cross-sectional view corresponding to the cross-section taken along the line II-II' of FIG. 1. In FIG. 5, the same reference numerals are used to denote the same elements as in FIGS. 1 to 4.

Referring to FIG. 5, a recess region RS1C of the semiconductor device 100C may include an upper enlarged region RS_SE. Sidewalls of the upper enlarged region RS_SE may extend outward from lower sidewalls of the recess region RS1C and vertically overlap gate spacers 138. A level LV3 at a bottom surface of the upper enlarged region RS_SE may be lower than a top level LV1 of a channel layer 114 and higher than a bottom level LV2 of the recess region RS1C.

Each of source and drain regions 120C may include an upper region 120C1 having a first width w21 and a lower region 120C2 having a second width w22, which is less than the first width w21. The upper region 120C1 may be located in the upper enlarged region RS_SE. The lower region 120C2 may be located under and formed continuously with the upper region 120C1. In example embodiments, an isotropic etching process is performed to form the upper region 120C1 and an anisotropic etching process is performed to form the lower region 120C2. Since each of the source and drain regions 120C includes the upper region 120C1 and the lower region 120C2, the performance of the semiconductor device 100C may be optimized by appropriately selecting the magnitude of tensile stress applied by the source and drain regions 120C to the channel region CH and a reduction in the length of an underlap portion due to the upper region 120C1. For example, by appropriately selecting widths and/or heights of the upper region 120C1 and the lower region 120C2, tensile stress applied to the channel region CH may increase due to an increase in the total volume of the source and drain regions 120C, while an increase in the resistance of the channel region CH may be prevented due to a reduction in the length of the underlap portion of the channel layer 114 that vertically overlaps the gate spacers 138. Accordingly, the semiconductor device 100C may have a low leakage current and improved on-current characteristics.

Figure 6:
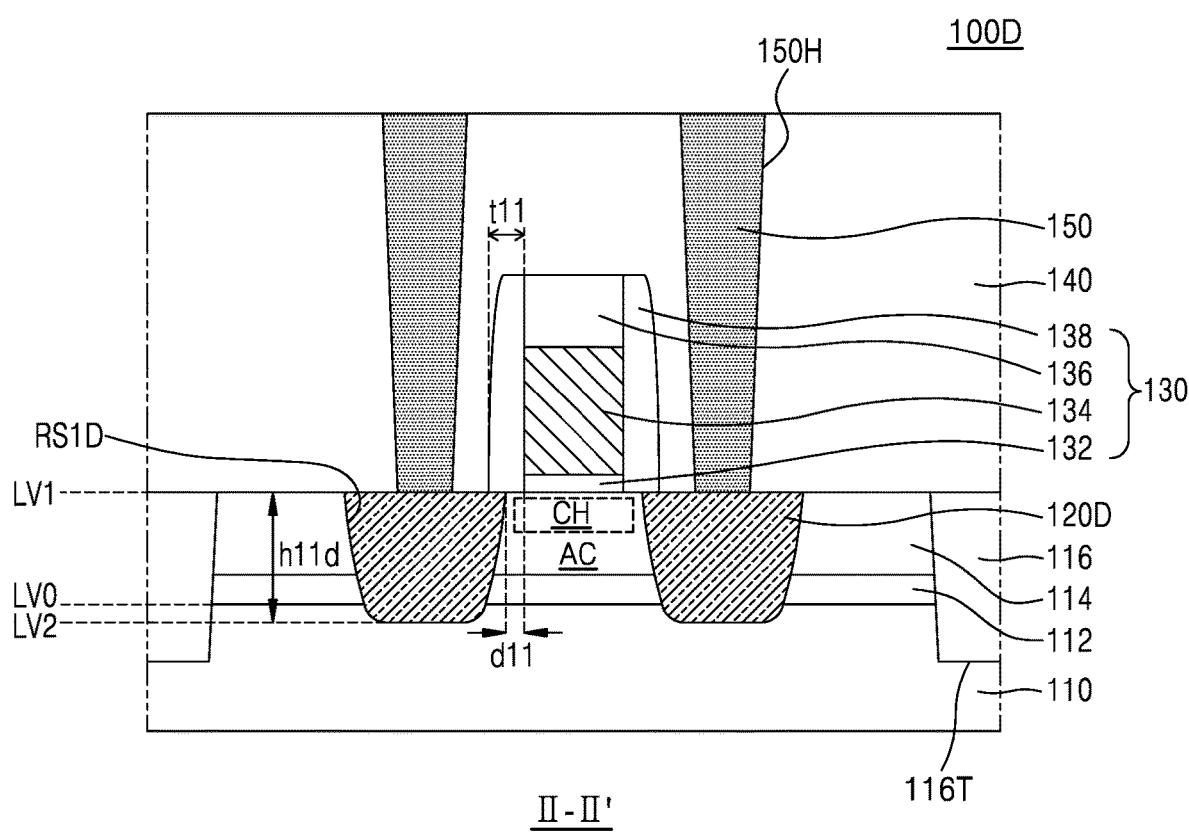
FIG. 6 is a cross-sectional view of a semiconductor device according to example embodiments.

FIG. 6 is a cross-sectional view of a semiconductor device 100D according to example embodiments. FIG. 6 is a cross-sectional view corresponding to the cross-section taken along the line II-II' of FIG. 1. In FIG. 6, the same reference numerals are used to denote the same elements as in FIGS. 1 to 5.

Referring to FIG. 6, a recess region RS1D of the semiconductor device 100D may pass through a channel layer 114 and a barrier insulating layer 112 and extend into a substrate 110. The recess region RS1D may have a first height h11d, which may be greater than a vertical thickness of the channel layer 114. A bottom level LV2 of the recess region RS1D may be lower than a top level LV0 of the substrate 110. Each of source and drain regions 120D may fill the recess region RS1D, and portions of sidewalls of each of the source and drain regions 120D may be surrounded by the barrier insulating layer 112. A bottom surface of each of the source and drain regions 120D may be in contact with a top surface of the substrate 110.

FIG. 6 illustrates an example in which the bottom level LV2 of the recess region RS1D is lower than the top level LV0 of the substrate 110. In other embodiments, unlike shown in FIG. 6, the bottom level LV2 of the recess region RS1D may be equal to the top level LV0 of the substrate 110. In this case, the bottom surface of each of the source and drain regions 120D may be located at the top level LV0 of the substrate 110 and in contact with the top surface of the substrate 110. In other embodiments, the bottom level LV2 of the recess region RS1D may be higher than the top surface of the substrate 110 and lower than a top level of the barrier insulating layer 112. In this case, the bottom surface of each of the source and drain regions 120D may be surrounded by the barrier insulating layer 112. In other embodiments, the bottom level LV2 of the recess region RS1D may be higher than the top level LV0 of the substrate 110 and equal to the top level of the barrier insulating layer 112. In this case, the bottom surface of each of the source and drain regions 120D may be in contact with the top surface of the barrier insulating layer 112.

According to example embodiments, since each of the source and drain regions 120D is located in the recess region RS1D configured to pass through the channel layer 114, a relatively high tensile stress may be applied by the source and drain regions 120D to the channel layer 114. Accordingly, the semiconductor device 100D may have a low leakage current and improved on-current characteristics.

Figure 7:
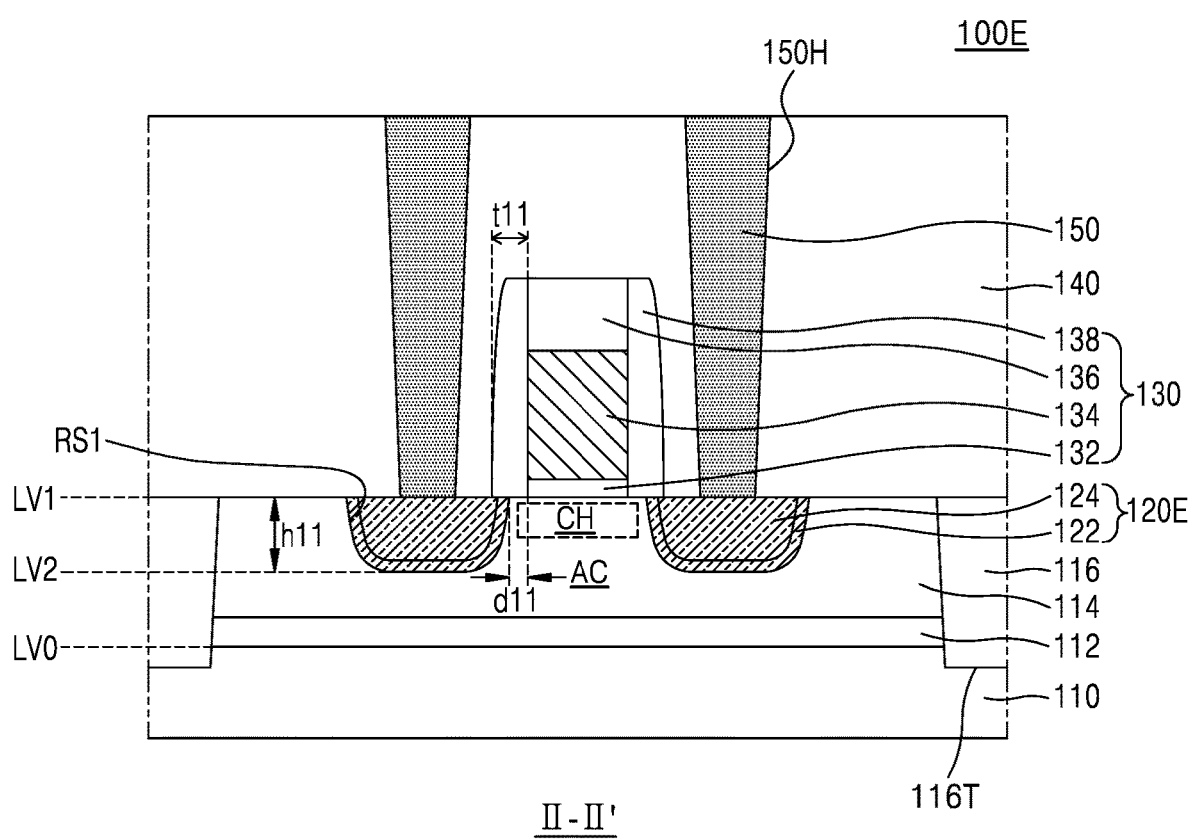
FIG. 7 is a cross-sectional view of a semiconductor device according to example embodiments.

FIG. 7 is a cross-sectional view of a semiconductor device 100E according to example embodiments. FIG. 7 is a cross-sectional view corresponding to the cross-section taken along the line II-II' of FIG. 1. In FIG. 7, the same reference numerals are used to denote the same elements as in FIGS. 1 to 6.

Referring to FIG. 7, source and drain regions 120E of the semiconductor device 100E may include a first material layer 122 conformally formed on inner walls of recess regions RS1 and a second material layer 124 filling the recess regions RS1 on the first material layer 122. The first material layer 122 and the second material layer 124 may include amorphous $InO_3$—ZnO (IZO), $InGaSiO_x$, phosphorus (P)-doped silicon, arsenic (As)-doped silicon, phosphorus-doped germanium, arsenic-doped germanium, or a combination thereof.

In example embodiments, the first material layer 122 may include impurities at a first concentration, and the second material layer 124 may include impurities at a second concentration, which is higher than the first concentration. In a manufacturing method according to an example embodiment, impurities may be doped in-situ at the first concentration during a process of forming the first material layer 122 in the recess region RS1 to a predetermined thickness. Thereafter, impurities may be doped in-situ at the second concentration during a process of forming the second material layer 124 on the first material layer 122 in the recess region RS1.

According to other embodiments, the first material layer 122 may include a material having a relatively small difference in lattice constant (or lattice mismatch) with a material included in a channel layer 114. The second material layer 124 may include a material having a relatively large difference in lattice constant with the material included in the channel layer 114. For example, the second material layer 124 has a lattice constant lager than a lattice constant of the first material layer 122. In this case, tensile stress (or compressive stress) applied by the source and drain regions 120E to the channel region CH may be increased or the occurrence of defects in the source and drain regions 120E may be inhibited.

FIG. 7 illustrates an example in which the source and drain regions 120E include two layers such as the first material layer 122 and the second material layer 124. In some examples, the source and drain regions 120E may have a multi-layered structure of at least three layers including the first material layer 122, the second material layer 124, and at least one additional material layer (not shown), which may be sequentially formed in the recess region RS1. For example, the first material layer 122 may include $InGaSiO_x$, the second material layer 124 may include $InGaZnO_x$, and the at least one additional material layer may include $InGaSiO_x$.

According to example embodiments, since the source and drain regions 122E have a double layer structure including impurities at different concentrations, the diffusion of the impurities from the source and drain regions 122E to the channel region CH may be prevented. Alternatively, a resistance of the source and drain regions 122E may be reduced, and an increase in resistance due to underlap portions of the channel layer 114 that vertically overlap gate spacers 138 may be prevented. Accordingly, the semiconductor device 100E may have a low leakage current and improved on-current characteristics.

Figure 8:
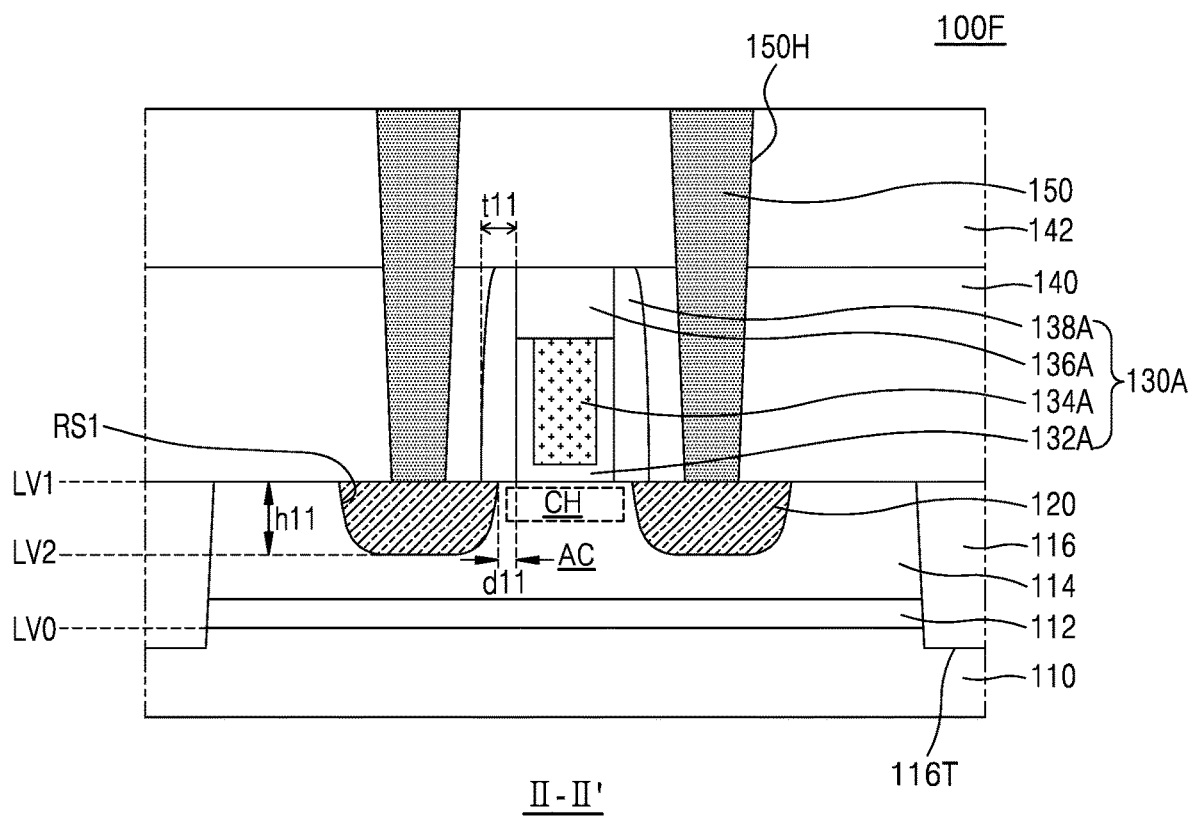
FIG. 8 is a cross-sectional view of a semiconductor device according to example embodiments.

FIG. 8 is a cross-sectional view of a semiconductor device 100F according to example embodiments. FIG. 8 is a cross-sectional view corresponding to the cross-section taken along the line II-II' of FIG. 1. In FIG. 8, the same reference numerals are used to denote the same elements as in FIGS. 1 to 7.

Referring to FIG. 8, a gate structure 130A of the semiconductor device 100F may include a gate insulating layer 132A, a gate electrode 134A, a gate capping layer 136A, and gate spacers 138A. The gate insulating layer 132A may surround both side surfaces and a bottom surface of the gate electrode 134A. The gate insulating layer 132A may be located between the gate electrode 134A and a channel layer 114 and between the gate electrode 134A and the gate spacers 138A.

The gate electrode 134A may include at least one of a metal, a metal nitride, or a metal carbide. For example, the gate electrode 134A may include aluminum (Al), copper (Cu), titanium (Ti), tantalum (Ta), tungsten (W), molybdenum (Mo), tantalum nitride (TaN), nickel silicide (NiSi), cobalt silicide (CoSi), titanium nitride (TiN), tungsten nitride (WN), titanium aluminide (TiAl), titanium aluminum nitride (TiAlN), tantalum carbonitride (TaCN), tantalum carbide (TaC), tantalum silicon nitride (TaSiN), or a combination thereof, but the inventive concept is not limited thereto. In example embodiments, the gate electrode 134A may include a work-function control metal-containing layer and a gap-fill metal film. The work-function control metal-containing layer may include at least one metal selected out of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The gap-fill metal film may include a tungsten (W) film or an aluminum (Al) film. In example embodiments, the gate electrode 134A may include a stack structure of TiAlC/TiN/W, a stack structure of TiN/TaN/TiAlC/TiN/W, or a stack structure of TiN/TaN/TiN/TiAlC/TiN/W, but the inventive concept is not limited thereto.

An interlayer insulating film 140 may have a top surface located at the same level as a top surface of the gate structure 130A. The interlayer insulating film 140 may surround sidewalls of gate spacers 138. An upper insulating layer 142 may be further located on the interlayer insulating film 140 and the gate structure 130A. A contact plug 150 may pass through the upper insulating layer 142 and the interlayer insulating film 140 and be connected to top surfaces of source and drain regions 120.

Since the gate electrode 134A includes at least one of the metal, the metal nitride, or the metal carbide, the gate electrode 134A may serve as a stressor configured to apply tensile stress to a portion (i.e., a channel region CH) of the channel layer 114 located under the gate electrode 134A. Accordingly, the semiconductor device 100F may have a low leakage current and improved on-current characteristics.

Figure 9:
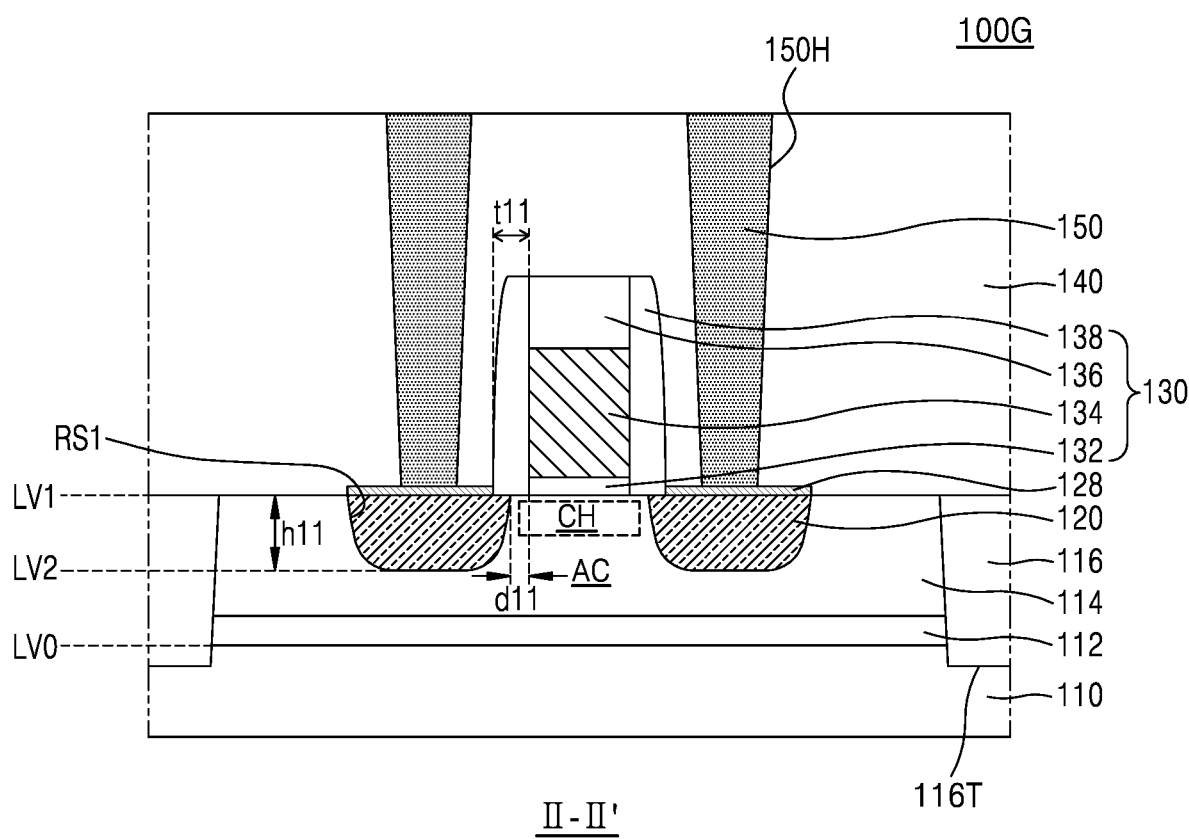
FIG. 9 is a cross-sectional view of a semiconductor device according to example embodiments.

FIG. 9 is a cross-sectional view of a semiconductor device 100G according to example embodiments. FIG. 9 is a cross-sectional view corresponding to the cross-section taken along the line II-II' of FIG. 1. In FIG. 9, the same reference numerals are used to denote the same elements as in FIGS. 1 to 8.

Referring to FIG. 9, a capping layer 128 of the semiconductor device 100G may be further located on source and drain regions 120. The capping layer 128 may include a compressively strained material. Also, the capping layer 128 may include a material, which may assist the source and drain regions 120 to maintain compressive strain and have a low contact resistance with a metal included in a contact plug 150. For example, the capping layer 128 may include at least one of phosphorus-doped silicon, arsenic-doped silicon, phosphorus-doped germanium, arsenic-doped germanium, doped $InZnO_x$, and InAs.

In example embodiments, the capping layer 128 may cover the entire top surfaces of the source and drain regions 120, and the contact plug 150 may be located on the capping layer 128. Thus, the source and drain regions 120 may not be in contact with the contact plug 150, and the capping layer 128 may be interposed between the source and drain regions 120 and the contact plug 150. In other embodiments, the contact plug 150 may further extend downward so that a bottom surface of the contact plug 150 may pass through the capping layer 128 and be in contact with top surfaces of the source and drain regions 120. In this case, the capping layer 128 may surround sidewalls of the contact plug 150 and cover the entire top surfaces of the remaining regions of the source and drain regions 120, which are not in contact with the contact plug 150.

FIGS. 10A to 10H are cross-sectional views illustrating a method of manufacturing a semiconductor device 100 according to example embodiments.

In FIGS. 10A to 10H, cross-sections corresponding to the cross-section taken along the line II-II' of FIG. 1 are illustrated in a process sequence. In FIGS. 10A to 10H, the same reference numerals are used to denote the same elements as in FIGS. 1 to 9.

Referring to FIG. 10A, a barrier insulating layer 112 may be formed on a substrate 110. For example, a top level LV0 of the substrate 110 may be the same level as a level of a bottom surface of the barrier insulating layer 112. The barrier insulating layer 112 may be formed using silicon oxide, silicon nitride, and aluminum oxide on the substrate 110. The barrier insulating layer 112 may be formed using a chemical vapor deposition (CVD) process, a thermal oxidation process, or an atomic layer deposition (ALD) process.

Subsequently, a channel layer 114 may be formed on the barrier insulating layer 112. The channel layer 114 may be formed using $InGaZnO_x$, $InGaSiO_x$, ITZO, IZO, $SnO_2$, HIZO, or YGZO. The channel layer 114 may be formed using a physical vapor deposition (PVD) process, a pulsed laser deposition (PLD) process, a CVD process, or an ALD process.

The channel layer 114 may have an amorphous structure or a c-axially aligned crystalline structure. In example embodiments, a laser annealing process for crystallizing the channel layer 114 may be further performed.

In some examples, the channel layer 114 may be doped with impurities of at least one element of fluorine (F), hydrogen (H), nitrogen (N), magnesium (Mg), yttrium (Y), ruthenium (Ru), and arsenic (As). For example, to dope the channel layer 114 with impurities of at least one element, the impurities may be doped in-situ during the formation of the channel layer 114 or impurity ions may be implanted after the formation of the channel layer 114.

Referring to FIG. 10B, a mask pattern (not shown) may be formed on the channel layer 114, and portions of the channel layer 114, the barrier insulating layer 112, and the substrate 110 may be removed using the mask pattern as an etch mask, thereby forming a device isolation trench 116T. Thereafter, an insulating layer (not shown) may be formed on the channel layer 114 to fill the device isolation trench 116T, and an upper portion of the insulating layer may be removed until the channel layer 114 is exposed. Thus, a device isolation film 116 may be formed inside the device isolation trench 116T. An active region AC may be defined by the device isolation film 116 in the channel layer 114.

Subsequently, a preliminary gate insulating layer (not shown), a preliminary gate electrode layer (not shown), and a gate capping layer 136 may be sequentially formed on the channel layer 114 and the device isolation film 116. The preliminary gate electrode layer and the gate capping layer may be patterned using the gate capping layer 136 as an etch mask, thereby forming a gate electrode 134 and a gate insulating layer 132.

Referring to FIG. 10C, a spacer insulating layer (not shown) may be formed using an ALD process or a CVD process to cover the gate capping layer 316, the gate electrode 134, and the gate insulating layer 132. An anisotropic etching process may be performed on the spacer insulating layer so that gate spacers 138 may be formed on sidewalls of the gate capping layer 316, the gate electrode 134, and the gate insulating layer 132.

Here, the gate capping layer 316, the gate electrode 134, the gate insulating layer 132, and the gate spacers 138 will be referred to as a gate structure 130. Each of the gate spacers 138 may have a first thickness t11 of about 2 nm to about 20 nm in a second direction (refer to Y direction in FIG. 2) at bottom surfaces thereof, but the inventive concept is not limited thereto.

Referring to FIG. 10D, portions of the channel layer 114 on both sides of the gate structure 130 may be etched to form preliminary recess regions RS1P. For example, the process of forming the preliminary recess regions RS1P may be an isotropic etching process using a wet or dry etchant, but the inventive concept is not limited thereto.

A bottom level LV2P of the preliminary recess region RS1P may be lower than a top level LV1 of the channel layer 114 and higher than the top level LV0 of the substrate 110. As shown in FIG. 10D, sidewalls of the preliminary recess region RS1P may be substantially aligned with sidewalls of the gate spacers 138. In this case, a shortest distance d1 1p between the preliminary recess region RS1P and the gate electrode 134 may be equal or similar to the first thickness t11 of the gate spacers 138. In other embodiments, the preliminary recess region RS1P may be formed to have a width and/or height that is less than that shown in FIG. 10D. The preliminary recess region RS1P may be located not to vertically overlap the gate spacers 138.

Figure 10E:
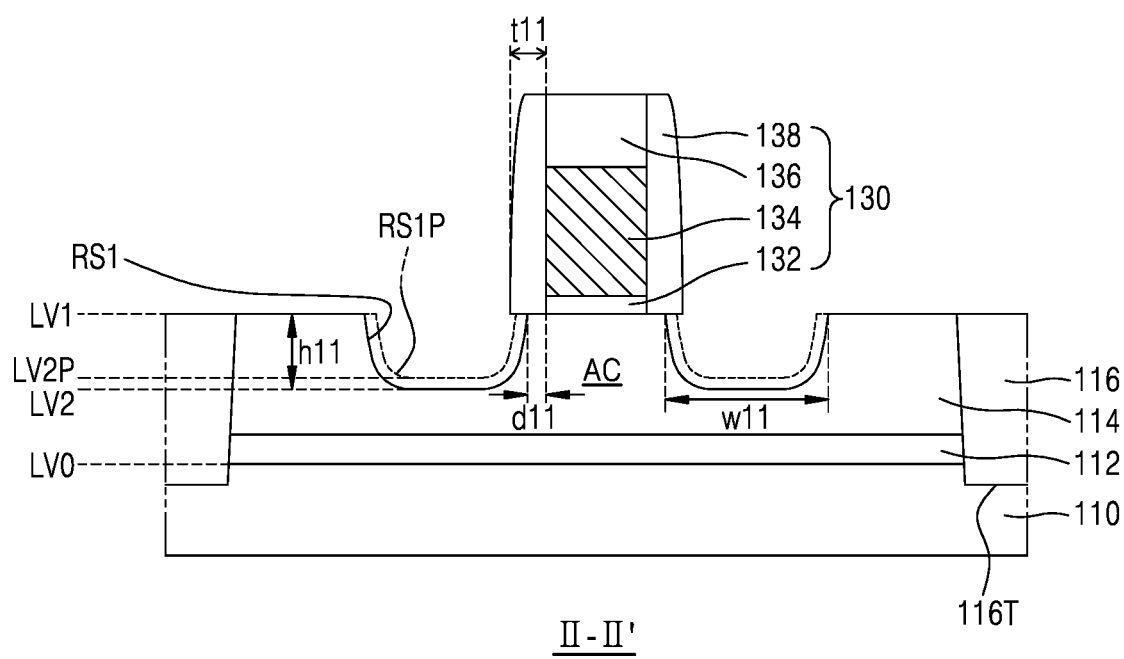
Figure 10E:
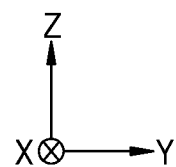

Referring to FIG. 10E, portions of the channel layer 114, which are exposed by sidewalls and bottom portions of the preliminary recess regions RS1P, may be further removed by as much as a predetermined thickness to form recess regions RS1. The removal process may be an isotropic etching process using a wet or dry etchant, but is not limited thereto.

In FIG. 10E, shapes of the preliminary recess regions RS1P are illustrated with dashed lines for comparison. The preliminary recess region RS1P may expand sideward and downward so that the recess region RS1 may have a width w11 and/or height h11 greater than that of the preliminary recess region RS1P. Thus, a shortest distance d11 between the recess region RS1 and the gate electrode 134 may be less than the shortest distance d11p between the preliminary recess region RS1P and the gate electrode 134.

Figure 10F:
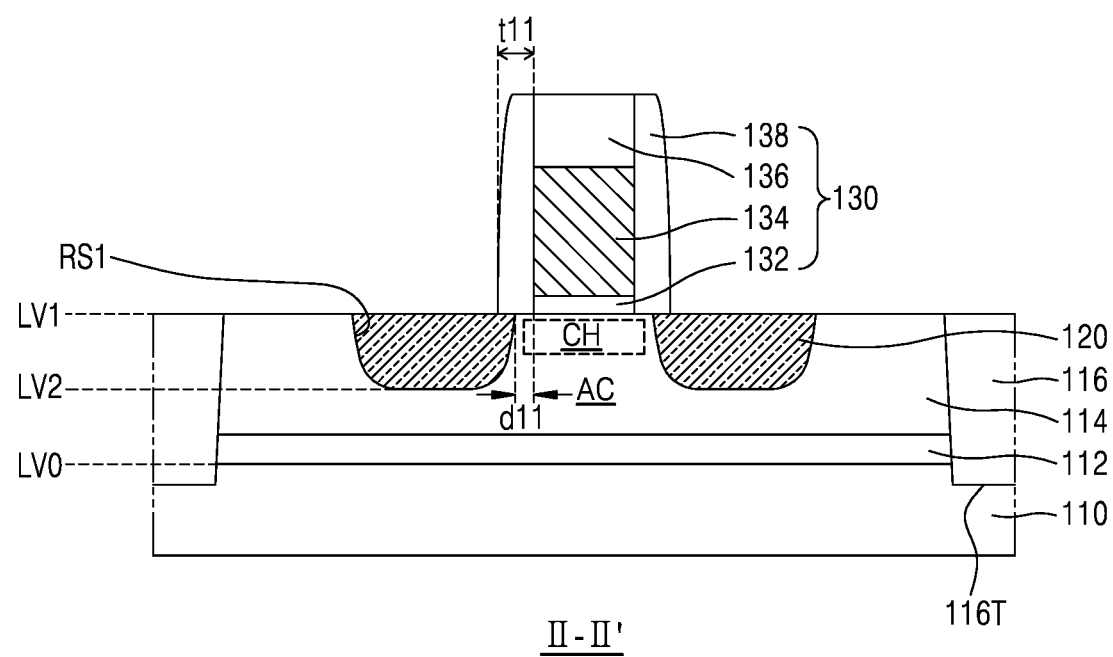

Referring to FIG. 10F, source and drain regions 120 may be formed to fill the recess regions RS1. The source and drain regions 120 may be formed by means of an epitaxial process using the channel layer 114, which is exposed by inner walls of the recess regions RS1 as a seed layer. The epitaxial process may be a vapor-phase epitaxy (VPE) process, a CVD process (e.g., an ultra-high vacuum chemical vapor deposition (UHV-CVD) process), a molecular beam epitaxy (MBE) process, or a combination thereof. In the epitaxial process, a liquid or gaseous precursor may be used as a precursor used to form the source and drain regions 120.

The source and drain regions 120 may be formed using amorphous $InO_3$—ZnO (IZO), $InGaSiO_x$, phosphorous (P)-doped silicon, arsenic (As)-doped silicon, phosphorus-doped germanium, or arsenic-doped germanium, or a combination thereof. The source and drain regions 120 may be doped in-situ with impurities during the SEG process, or impurity ions may be implanted after the formation of the source and drain regions 120.

Figure 10G:
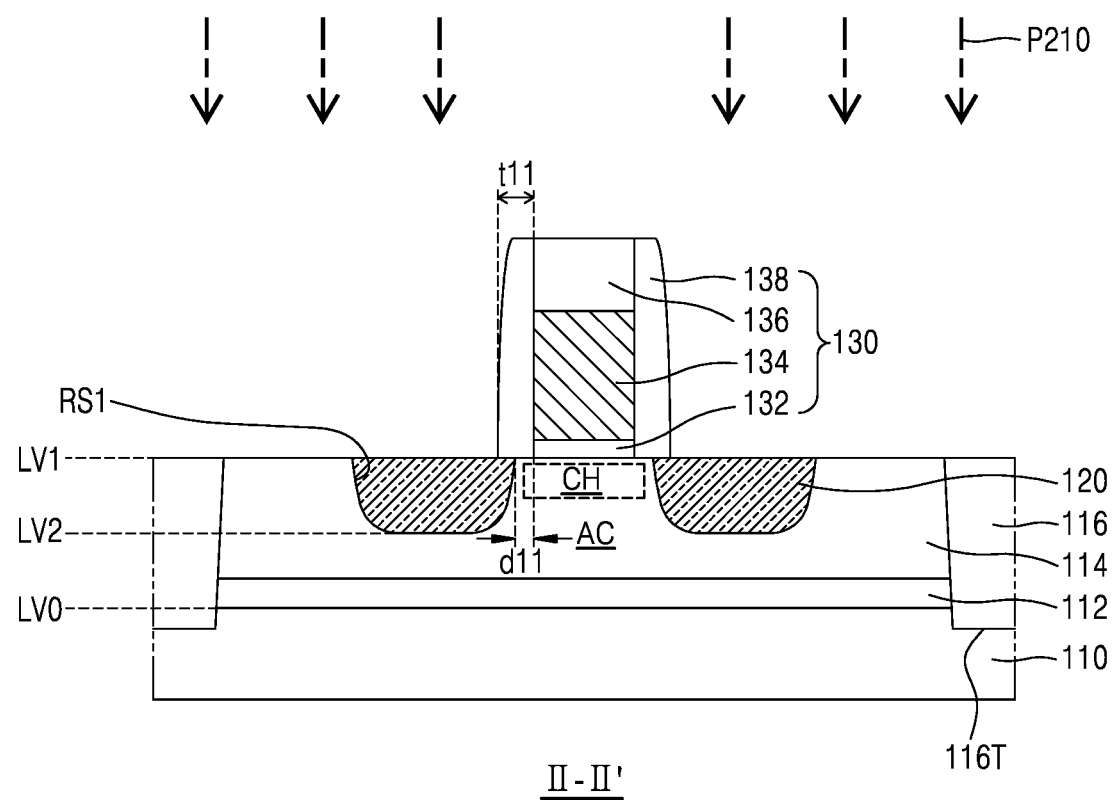

Referring to FIG. 10G, a laser annealing process P210 may be performed on the source and drain regions 120. The source and drain regions 120 may be crystallized due to the laser annealing process P210. For example, during the formation of the source and drain regions 120, the source and drain regions 120 may be formed using amorphous $InGaSiO_x$ and crystallized into c-axially aligned crystalline $InGaSiO_x$ due to the laser annealing process P210.

In some examples, the laser annealing process P210 may be omitted.

Figure 10H:
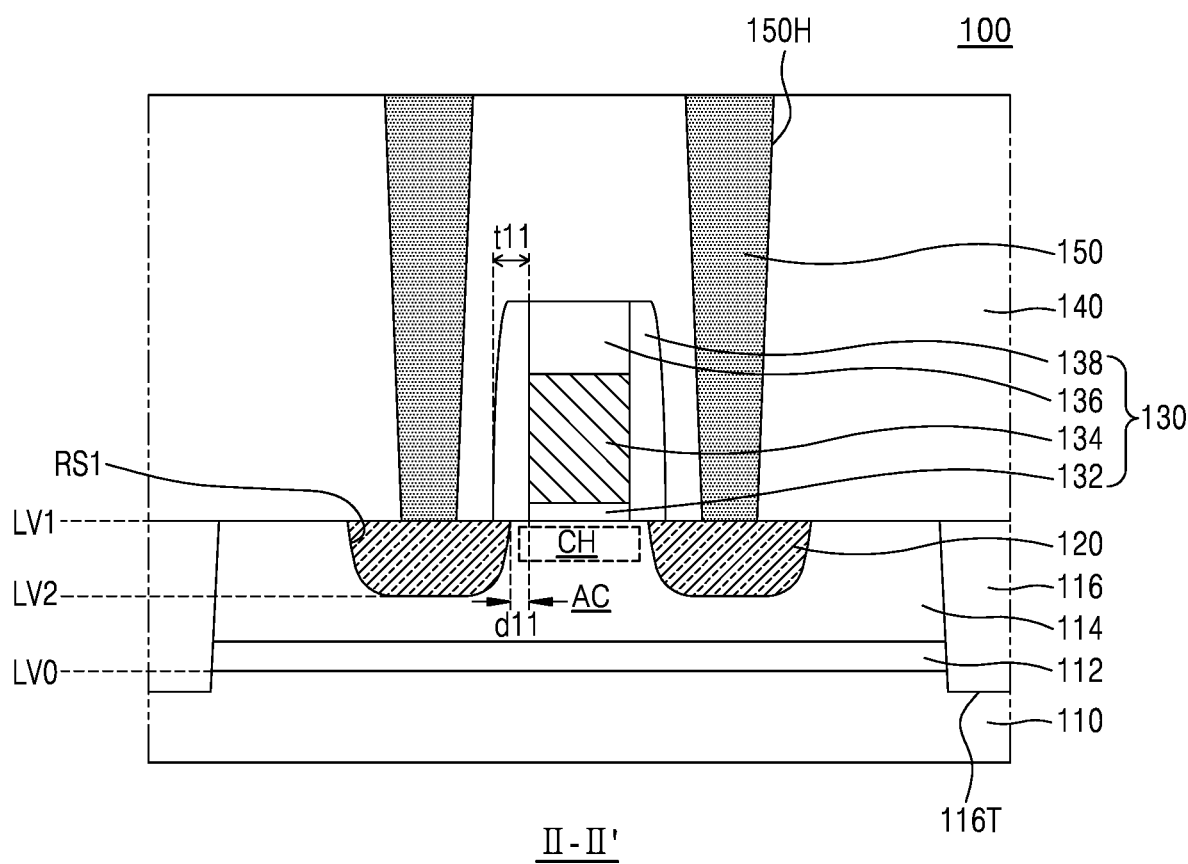
Figure 10H:
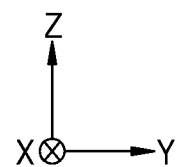

Referring to FIG. 10H, an interlayer insulating film 140 may be formed on the channel layer 114, the source and drain regions 120, and the gate structure 130. Thereafter, a mask pattern (not shown) may be formed on the interlayer insulating film 140, and contact holes 150H may be formed using the mask pattern as an etch mask. The contact holes 150H may pass through the interlayer insulating film 140 and expose top surfaces of the source and drain regions 120.

A conductive layer (not shown) may be formed on the interlayer insulating film 140 to fill the contact holes 150H, and an upper portion of the conductive layer may be removed until a top surface of the interlayer insulating film 140 is exposed. Thus, contact plugs 150 may be formed inside the contact holes 150H. Each of the contact plugs 150 may have a double layer structure including a metal filling layer (not shown) and a conductive barrier layer (not shown) configured to surround side surfaces and a bottom surface of the metal filling layer.

The above-described processes may be performed to complete the manufacture of the semiconductor device 100.

According to the above-described example embodiments, due to the source and drain regions 120 that are formed in the recess regions RS1 and configured to apply tensile stress to the channel layer 114, the mobility and DOS of carriers in the channel layer 114 including a homologous oxide may be improved. In addition, the recess regions RS1 may vertically overlap the gate spacers 138 due to the process of expanding the preliminary recess regions RS1P in a lateral direction. Thus, an increase in resistance due to an underlap portion located under the channel layer 114 may be prevented. Accordingly, the semiconductor device 100 may have both a low leakage current and improved on-current characteristics.

FIGS. 11A to 11E are cross-sectional views illustrating a method of manufacturing a semiconductor device 100F according to example embodiments.

In FIGS. 11A to 11E, cross-sections corresponding to the cross-section taken along the line II-II' of FIG. 1 are illustrated in a process sequence. In FIGS. 11A to 11E, the same reference numerals are used to denote the same elements as in FIGS. 1 to 9 and 10A to 10H.

To begin with, the processes described with reference to FIGS. 10A to 10G may be performed to form a structure including a sacrificial gate structure 130 and source and drain regions 120. The sacrificial gate structure 130 may include a sacrificial gate insulating layer 132, a sacrificial gate electrode 134, a sacrificial gate capping layer 136, and gate spacers 138A.

Figure 11A:
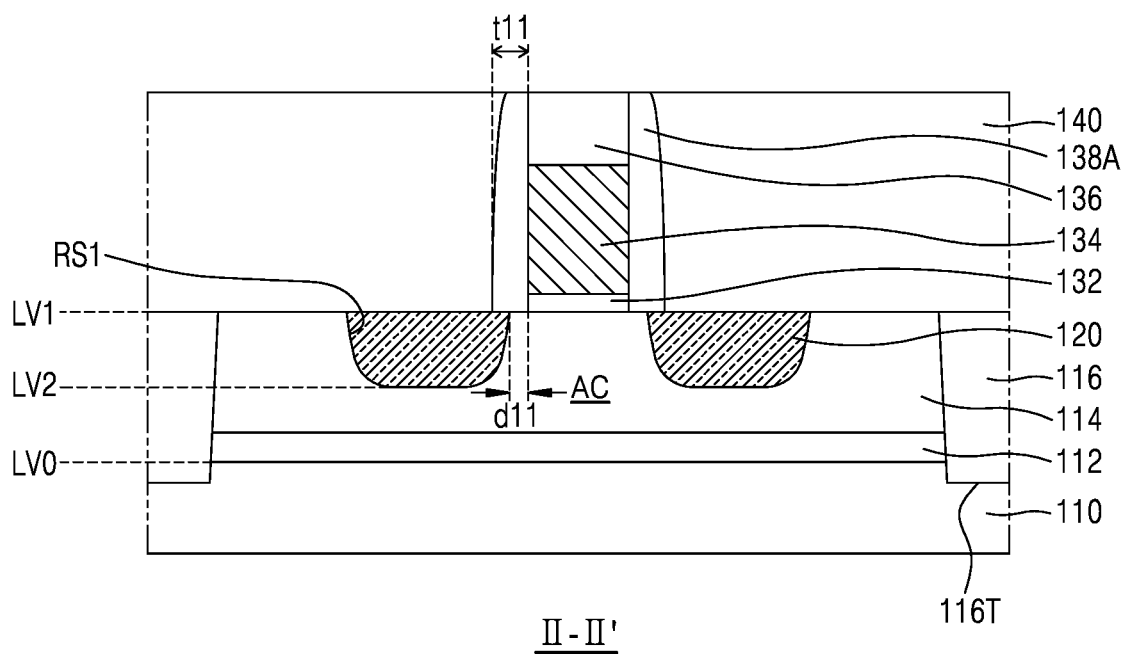
FIGS. 11A to 11E are cross-sectional views illustrating a method of manufacturing a semiconductor device according to example embodiments.
Figure 11A:
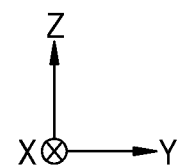

Referring to FIG. 11A, an insulating layer (not shown) may be formed on a channel layer 114, the source and drain regions 120, the sacrificial gate capping layer 136, and the gate spacers 138A. An upper portion of the insulating layer may be planarized until top surfaces of the sacrificial gate capping layer 136 and the gate spacers 138A are exposed, thereby forming an interlayer insulating film 140.

Figure 11B:
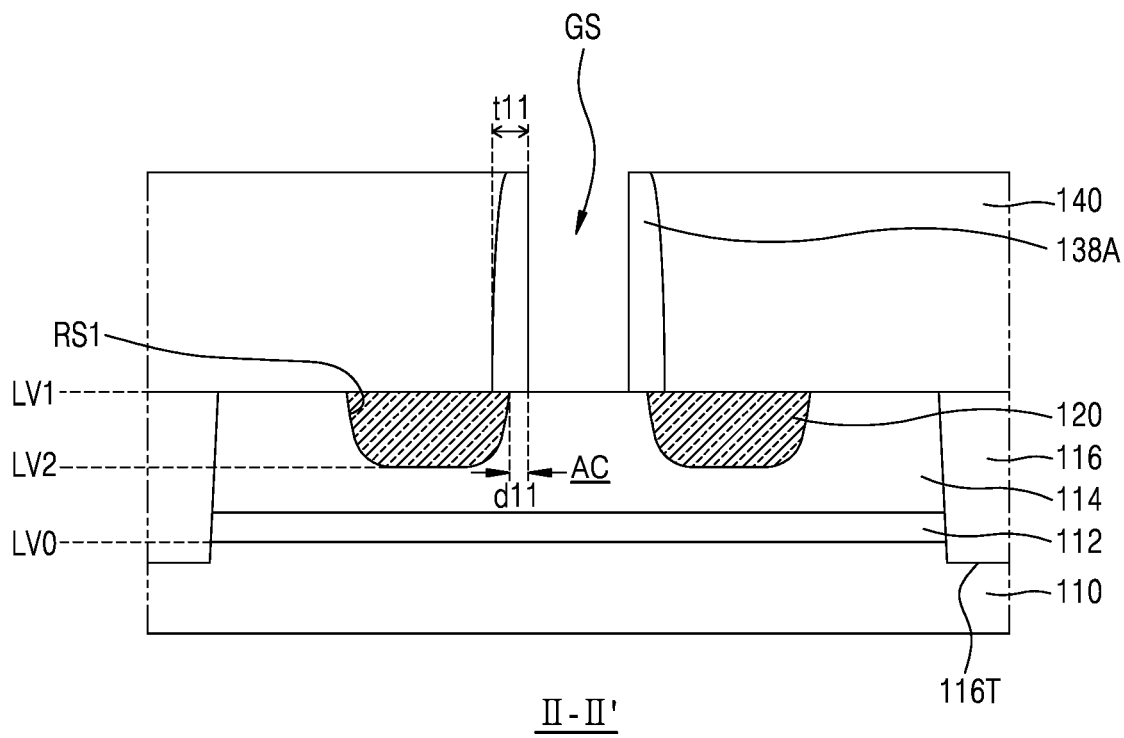

Referring to FIG. 11B, the sacrificial gate capping layer (refer to 136 in FIG. 11A), the sacrificial gate electrode (refer to 134 in FIG. 11A), and the sacrificial gate insulating layer (refer to 132 in FIG. 11A) may be removed so that a gate space GS may be defined between sidewalls of the gate spacer 138A. In example embodiments, the process of removing the sacrificial gate capping layer 136, the sacrificial gate electrode 134, and the sacrificial gate insulating layer 132 may include a wet etching process. The wet etching process may be performed using, for example, an etchant including $HNO_3$, diluted fluoric acid (DHF), $NH_4OH$, tetramethyl ammonium hydroxide (TMAH), KOH, or a combination thereof.

Figure 11C:
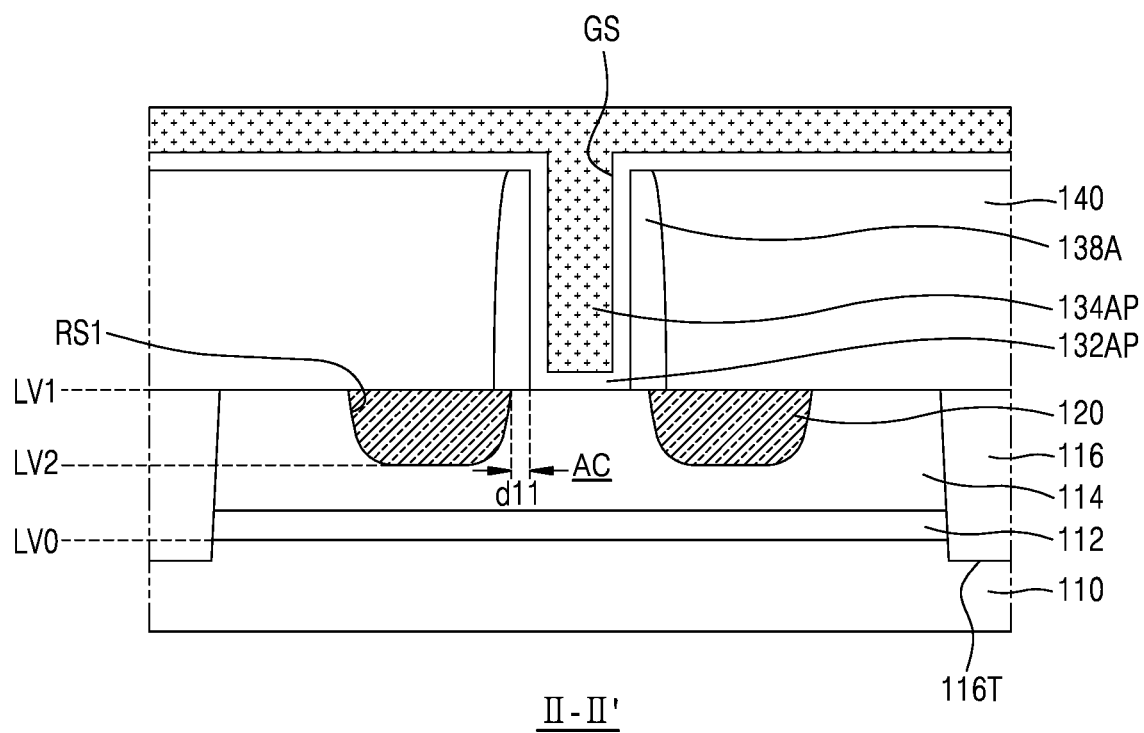

Referring to FIG. 11C, a preliminary gate insulating layer 132AP may be formed on inner walls of the gate space GS. Thereafter, a preliminary gate electrode layer 134AP may be formed on the preliminary gate insulating layer 132AP to fill the inside of the gate space GS.

Figure 11D:
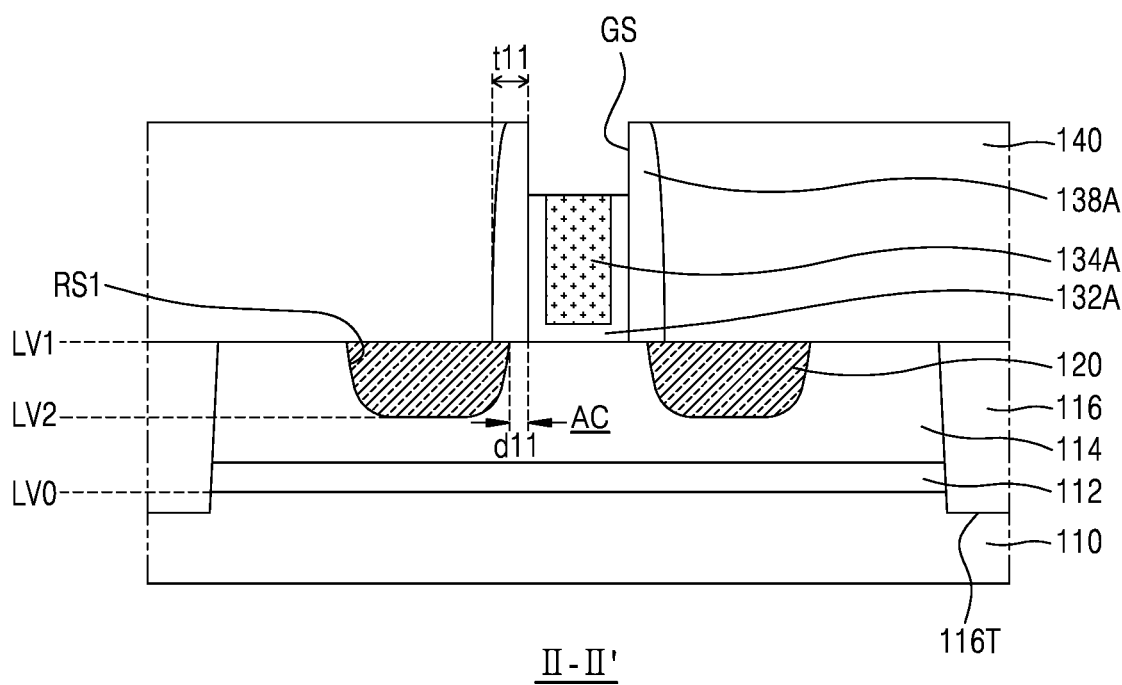
Figure 11D:
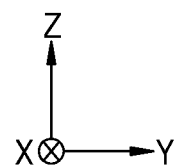

Referring to FIG. 11D, an upper portion of the preliminary gate electrode layer (refer to 134AP in FIG. 11C) and an upper portion of the preliminary gate insulating layer (refer to 132AP in FIG. 11C) may be etched back to form a gate electrode 134A and a gate insulating layer 132A. An upper portion of the gate space GS may be exposed again due to the etch-back process.

Figure 11E:
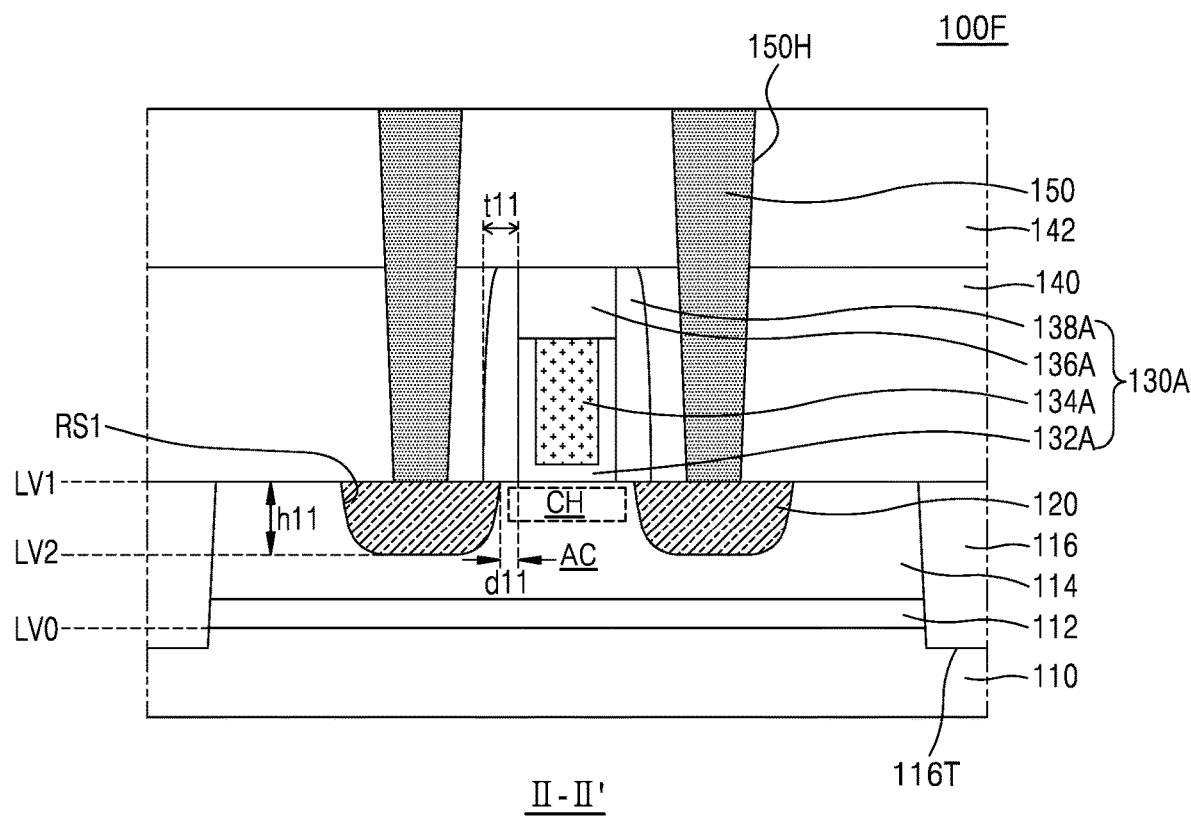

Referring to FIG. 11E, an insulating layer (not shown) may be formed on the gate electrode 134A and the gate insulating layer 132A to fill the remaining portion of the gate space GS. Thereafter, an upper portion of the insulating layer may be removed until a top surface of the interlayer insulating film 140 or the top surfaces of the gate spacer 138A are exposed. Thus, a gate capping layer 136A may be formed to fill the gate space GS.

Thereafter, an upper insulating layer 142 may be formed on the gate capping layer 136A, the gate spacers 138A and the interlayer insulating film 140. Subsequently, contact holes 150H may be formed to pass through the upper insulating layer 142 and the interlayer insulating film 140, and contact plugs 150 may be formed to fill the contact holes 150H.

The above-described processes may be performed to complete the manufacture of the semiconductor device 100F.

In other embodiments, during a process of forming recess regions RS1A, portions of sidewalls of the channel layer 114, which are located at a level lower than a top level LV1 of the channel layer 114, may be exposed to an etchant or collide with an etchant more than a portion of the channel layer 114, which is located at the top level LV1 of the channel layer 114. Thus, the recess region RS1A may expand in a lateral direction to the largest extent at a lower level than the top level LV1 of the channel layer 114, and each of the source and drain regions 120A may include a protrusion 120_P. In this case, the semiconductor device 100A described with reference to FIG. 3 may be formed.

In other embodiments, to form recess regions RS1B, an anisotropic etching process may be performed, or an anisotropic etching process and a subsequent enlarging process may be performed. Thus, the recess regions RS1B including step units 120_S may be formed. In this case, the semiconductor device 100B described with reference to FIG. 4 may be formed.

In other embodiments, to form recess regions RS1C, two etching processes may be performed. For example, upper enlarged regions RS_SE having a first width w21 may be firstly formed using a first etching process. Thereafter, bottom portions of the recess regions RS1C having a second width w22 may be formed using a second etching process. In this case, the first etching process may be isotropic etching process and the second etching process may be anisotropic etching process. In another case, the bottom portions of the recess regions RS1C having the second width w22 may be firstly formed using the first etching process. Thereafter, the upper enlarged regions RS_SE having the first width w21 may be formed using the second etching process. In this case, the first etching process may be an anisotropic etching process and the second etching process may be an isotropic etching process and the semiconductor device 100C described with reference to FIG. 5 may be formed.

Typical example embodiments of the inventive concept are disclosed in the above description and the drawings. Although specific terms are employed, they are used in a generic and descriptive sense only and not for purposes of limitation. It will be understood by those of ordinary skill in the art that various changes in form and details may be made to the disclosed embodiments without departing from the spirit and scope of the inventive concept as defined by the following claims.

What is claimed is:

1. A semiconductor device comprising:
 a channel layer located on a substrate, the channel layer comprising a conductive oxide;
 a gate structure located on the channel layer, the gate structure comprising a gate electrode and gate spacers located on both sidewalls of the gate electrode; and
 source and drain regions located on both sides of the gate structure in recess regions having a first height from a top surface of the channel layer,
 wherein the source and drain regions are configured to apply tensile stress to a portion of the channel layer located under the gate structure.

2. The semiconductor device of claim 1, wherein the conductive oxide comprises at least one of $InGaZnO_x$, $InGaSiO_x$, $InSnZnO_x$ (ITZO), $InZnO_x$ (IZO), $SnO_2$, $HfInZnO_x$ (HIZO), and $YbGaO_3(ZnO)_5$ (YGZO).

3. The semiconductor device of claim 1, wherein the conductive oxide comprises a material expressed by formula $RAO_3(MO)_m$, and
 wherein R is at least one of scandium (Sc), ytterbium (Yb), lutetium (Lu), and indium (In), A is at least one of gallium (Ga), aluminum (Al), iron (Fe), and indium (In), M is at least one of zinc (Zn) and magnesium (Mg), and m is an integer.

4. The semiconductor device of claim 1, wherein each of the source and drain regions comprises at least one of amorphous $InO_3$—ZnO (IZO), $InGaSiO_x$, phosphorus (P)-doped silicon, arsenic (As)-doped silicon, phosphorous-doped germanium, and arsenic-doped germanium.

5. The semiconductor device of claim 1, wherein the gate structure extends in a first direction parallel to a top surface of the substrate,
 wherein each of the gate spacers has a first thickness in a second direction perpendicular to the first direction and parallel to the top surface of the substrate, and
 wherein a distance between the gate electrode and each of the source and drain regions in the second direction is smaller than the first thickness.

6. The semiconductor device of claim 1, wherein the gate spacers vertically partially overlap the source and drain regions.

7. The semiconductor device of claim 1, wherein a boundary between a sidewall and a bottom portion of each of the recess regions has a rounded shape.

8. The semiconductor device of claim 1, wherein each of the source and drain regions comprises:
 a first material layer conformally located on inner walls of the recess regions, the first material layer including impurities at a first concentration; and
 a second material layer filling the recess regions on the first material layer, the second material layer including impurities at a second concentration different from the first concentration.

9. The semiconductor device of claim 1, wherein the maximum width of each of the source and drain regions is at the same level as top surfaces of the source and drain regions in a first direction parallel to a top surface of the substrate.

10. The semiconductor device of claim 1, wherein each of the source and drain regions comprises a protrusion, which protrudes outward in a first direction parallel to a top surface of the substrate, and
 wherein the maximum width in the first direction of each of the source and drain regions is at a level that is lower than top surfaces of the source and drain regions and higher than bottom surfaces of the source and drain regions.

11. The semiconductor device of claim 1, wherein each of the source and drain regions comprises:
 an upper region having a first width in a first direction parallel to a top surface of the substrate; and
 a lower region located under the upper region, the lower region having a second width smaller than the first width in the first direction.

12. The semiconductor device of claim 1, wherein the gate structure further comprises a gate insulating layer located between the gate electrode and the channel layer and between the gate electrode and the gate spacers,
 wherein the gate electrode comprises at least one of a metal, a metal nitride, and a metal carbide, and
 wherein the gate electrode is configured to apply tensile stress to a portion of the channel layer located under the gate structure.

13. The semiconductor device of claim 1, further comprising:
 a capping layer located on the source and drain regions; and
 a contact plug located on the capping layer,
 wherein the capping layer comprises at least one of phosphorus-doped silicon, arsenic-doped silicon, phosphorus-doped germanium, arsenic-doped germanium, doped indium zinc oxide (InZnO), and indium arsenide (InAs).

14. The semiconductor device of claim 1, wherein the channel layer has a first lattice constant and each of the source and drain regions includes a material layer having a second lattice constant lower than the first lattice constant.

15. The semiconductor device of claim 1, further comprising:
 an insulating layer located between the substrate and the channel layer,
 wherein the insulating layer includes at least one of silicon oxide, silicon nitride, and aluminum oxide.

16. A semiconductor device comprising:
 a channel layer located on a substrate, the channel layer comprising a conductive oxide;
 a gate structure located on the channel layer, the gate structure comprising a gate electrode and gate spacers located on both sides of the gate electrode; and
 source and drain regions located on both sides of the gate structure in recess regions having a first height from a top surface of the channel layer,
 wherein the source and drain regions partially overlap the gate spacers in a direction perpendicular to a top surface of the substrate.

17. The semiconductor device of claim 16, wherein the gate structure extends in a first direction parallel to a top surface of the substrate,
 wherein each of the gate spacers has a first thickness in a second direction perpendicular to the first direction and parallel to the top surface of the substrate, and
 wherein a distance between the gate electrode and each of the source and drain regions in the second direction is smaller than the first thickness.

18. The semiconductor device of claim 16, wherein each of the source and drain regions comprises a compressively strained material, and
 wherein the source and drain regions are configured to apply tensile stress to a portion of the channel layer located under the gate structure.

19. A semiconductor device comprising:
a channel layer located on a substrate;
a gate structure located on the channel layer, the gate structure comprising gate spacers located on both sidewalls of the gate electrode; and
source and drain regions located on both sides of the gate structure in recess regions having a first height from a top surface of the channel layer, the source and drain regions being configured to apply tensile stress to a portion of the channel layer located under the gate structure,
wherein the channel layer comprises a material expressed by formula $RAO_3(MO)_m$,
wherein R is at least one of scandium (Sc), ytterbium (Yb), lutetium (Lu), and indium (In), A is at least one of gallium (Ga), aluminum (Al), iron (Fe), and indium (In), M is at least one of zinc (Zn) and magnesium (Mg), and m is an integer.

20. The semiconductor device of claim 19, further comprising:
a capping layer located on the source and drain regions; and
a contact plug located on the capping layer,
wherein the capping layer comprises a compressively strained material, and
wherein the capping layer comprises at least one of phosphorus-doped silicon, arsenic-doped silicon, phosphorus-doped germanium, arsenic-doped germanium, doped indium zinc oxide (InZnO), and indium arsenide (InAs).

* * * * *